(12) United States Patent
Goto et al.

(10) Patent No.: US 11,750,172 B2
(45) Date of Patent: Sep. 5, 2023

(54) MULTILAYER PIEZOELECTRIC SUBSTRATE

(71) Applicant: SKYWORKS SOLUTIONS, INC., Irvine, CA (US)

(72) Inventors: Rei Goto, Osaka (JP); Keiichi Maki, Suita (JP); Gong Bin Tang, Moriguchi (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 162 days.

(21) Appl. No.: 16/993,551

(22) Filed: Aug. 14, 2020

(65) Prior Publication Data

US 2021/0058057 A1 Feb. 25, 2021

Related U.S. Application Data

(60) Provisional application No. 62/889,613, filed on Aug. 21, 2019.

(51) Int. Cl.
| | |
|---|---|
| *H03H 9/02* | (2006.01) |
| *H03H 9/25* | (2006.01) |
| *H03H 9/64* | (2006.01) |

(52) U.S. Cl.
CPC .... *H03H 9/02574* (2013.01); *H03H 9/02559* (2013.01); *H03H 9/02834* (2013.01); *H03H 9/25* (2013.01); *H03H 9/6406* (2013.01)

(58) Field of Classification Search
CPC .. H03H 9/02574; H03H 9/02834; H03H 9/25; H03H 9/6406
See application file for complete search history.

(56) References Cited

U.S. PATENT DOCUMENTS

| | | |
|---|---|---|
| 5,646,584 A | 7/1997 | Kondratyev et al. |
| 7,230,512 B1 | 6/2007 | Carpenter et al. |
| 9,438,201 B2 | 9/2016 | Hori et al. |
| 2014/0339957 A1 | 11/2014 | Tajima et al. |
| 2017/0063332 A1* | 3/2017 | Gilbert ............... H03H 9/02574 |
| 2017/0214386 A1 | 7/2017 | Kido |
| 2017/0222618 A1 | 8/2017 | Inoue et al. |
| 2017/0250669 A1 | 8/2017 | Kuroyanagi et al. |
| 2017/0272051 A1 | 9/2017 | Kurihara et al. |
| 2017/0273183 A1 | 9/2017 | Kawasaki et al. |
| 2017/0288629 A1* | 10/2017 | Bhattacharjee .... H03H 9/02275 |
| 2017/0359048 A1 | 12/2017 | Yasuda |
| 2018/0013404 A1 | 1/2018 | Kawasaki et al. |
| 2018/0316329 A1 | 11/2018 | Guenard et al. |
| 2018/0367119 A1 | 12/2018 | Lee |
| 2019/0288661 A1* | 9/2019 | Akiyama ........... H03H 9/02614 |
| 2020/0067482 A1 | 2/2020 | Maki et al. |
| 2020/0366270 A1 | 11/2020 | Matsuoka |
| 2021/0159886 A1 | 5/2021 | Goto et al. |
| 2022/0014175 A1 | 1/2022 | Nagatomo et al. |
| 2022/0077840 A1 | 3/2022 | Caron |

* cited by examiner

*Primary Examiner* — Samuel S Outten
(74) *Attorney, Agent, or Firm* — Lando & Anastasi, LLP

(57) ABSTRACT

A surface acoustic wave (SAW) resonator comprises a plurality of interdigital transducer electrodes disposed on a multilayer piezoelectric substrate (MPS) including a layer of piezoelectric material having a lower surface bonded to an upper surface of a layer of a second material different from the piezoelectric material that improves the temperature stability and reliability of the SAW resonator, and a layer of dielectric material disposed on an upper surface of the interdigital transducer electrodes and MPS.

18 Claims, 26 Drawing Sheets

| | TCSAW (BASELINE) | MULTILAYER PIEZOELECTRIC SUBSTRATE |
|---|---|---|
| STRUCTURE | SiO2, Al/Mo, 128LN | SiO2, Al/Mo, 128LN, Si (>5λ (20μm)) |
| TCF(fs/fp) | −33/−22ppm | −23/−12ppm |
| Q(@LB) | 2500 | 2500 |
| K2 | 8.5% | 8.5% |
| WAFER HANDLING | MID | EASY |
| HEAT DISSIPATION | MID | GOOD |

FIG.3 ial. The lower surface of the layer of piezoelectric material may be covalently bonded to the layer of the second material.

MULTILAYER PIEZOELECTRIC SUBSTRATE

CROSS-REFERENCE TO RELATED APPLICATIONS

This application claims priority under 35 U.S.C. § 119(e) to U.S. Provisional Patent Application No. 62/889,613, titled MULTILAYER PIEZOELECTRIC SUBSTRATE, filed Aug. 21, 2019, the content of which being incorporated herein in its entirety for all purposes.

BACKGROUND

Technical Field

Embodiments of this disclosure relate to acoustic wave devices, improvement in the behavior of same at high power levels, and the suppression of spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer or diplexer.

SUMMARY

In accordance with one aspect, there is provided a surface acoustic wave (SAW) resonator. The SAW resonator comprises a multilayer piezoelectric substrate, the multilayer piezoelectric substrate including a layer of piezoelectric material having a lower surface bonded to an upper surface of a layer of a second material different from the piezoelectric material that improves the temperature stability and reliability of the SAW resonator, a plurality of interdigital transducer electrodes disposed on the multilayer piezoelectric substrate, and a layer of dielectric material disposed on an upper surface of the interdigital transducer electrodes and the multilayer piezoelectric substrate.

In some embodiments, the layer of second material is a continuous layer. The layer of second material may be bonded to the lower surface of the layer of piezoelectric material beneath an entirety of the SAW resonator.

In some embodiments, the second material has a lower coefficient of thermal expansion than the piezoelectric material.

In some embodiments, the second material has a higher thermal conductivity than the piezoelectric material.

In some embodiments, the second material has a higher toughness than the piezoelectric material.

In some embodiments, the second material is selected from the group consisting of silicon, aluminum nitride, silicon nitride, magnesium oxide spinel, magnesium oxide crystal, or sapphire.

In some embodiments, the layer of piezoelectric material is thinner than the layer of the second material. The layer of piezoelectric material may be at least twice as thick as a wavelength of a main acoustic wave excitable by the SAW resonator.

In some embodiments, the layer of piezoelectric material is directly bonded to the layer of the second material. The layer of piezoelectric material may be covalently bonded to the layer of the second material.

In some embodiments, the lower surface of the layer of piezoelectric material bonded to the layer of the second material is roughened.

In some embodiments, a plurality of obstacles formed of the second material extend from the upper surface of the layer of the second material into the layer of piezoelectric material.

In some embodiments, the layer of piezoelectric material is bonded to the layer of the second material with an adhesive material.

In some embodiments, the SAW resonator further comprises a layer of silicon dioxide disposed between the layer of piezoelectric material and the layer of the second material. The lower surface of the layer of piezoelectric material may be directly bonded to an upper surface of the layer of silicon dioxide. The upper surface of the layer of second material may be directly bonded to a lower surface of the layer of silicon dioxide.

In some embodiments, one of the upper surface or the lower surface of the layer of silicon dioxide is roughened.

In some embodiments, each of the upper surface and the lower surface of the layer of silicon dioxide is roughened.

In some embodiments, a lower surface of the layer of the second material is roughened.

In some embodiments, the adhesive material is a metal.

In some embodiments, the upper surface of the layer of second material includes a trap rich layer.

In accordance with another aspect, there is provided a radio frequency filter including at least one surface acoustic wave resonator. The at least one surface acoustic wave resonator comprises a plurality of interdigital transducer electrodes disposed on a multilayer piezoelectric substrate including a layer of piezoelectric material having a lower surface bonded to an upper surface of a layer of a second material different from the piezoelectric material that reduces insertion loss, increases power durability, increases reliability, and/or reduces sensitivity of operating parameters of the filter to changes in temperature.

In accordance with another aspect, there is provided electronics module having at least one radio frequency filter including at least one surface acoustic wave resonator. The at least one surface acoustic wave resonator comprises a multilayer piezoelectric substrate including a layer of piezoelectric material having a lower surface, and a layer of a second material different from the piezoelectric material having an upper surface bonded to the lower surface of the layer of piezoelectric material, the second material reducing insertion loss, increasing power durability, increasing reliability, and/or reducing sensitivity of operating parameters of the filter to changes in temperature. A plurality of interdigital transducer electrodes are disposed on the multilayer piezoelectric substrate.

In accordance with another aspect, there is provided an electronic device with an electronics module having at least one radio frequency filter including at least one surface acoustic wave resonator. The at least one surface acoustic wave resonator comprises a multilayer piezoelectric substrate including a layer of piezoelectric material having a lower surface, and a layer of a second material different from the piezoelectric material having an upper surface bonded to the lower surface of the layer of piezoelectric material, the second material reducing insertion loss, increasing power durability, increasing reliability, reducing sensitivity of operating parameters of the filter to changes in temperature, and/or increasing battery life of the electronic device. A plurality of interdigital transducer electrodes are disposed on the multilayer piezoelectric substrate.

BRIEF DESCRIPTION OF THE DRAWINGS

Embodiments of this disclosure will now be described, by way of non-limiting example, with reference to the accompanying drawings.

FIG. 3 illustrates a comparison between features of an example of a SAW resonator formed on a lithium niobate substrate and a comparative example of a SAW resonator formed on a multilayer piezoelectric substrate including a layer of lithium niobate disposed on a layer of silicon;

DETAILED DESCRIPTION OF CERTAIN EMBODIMENTS

Figure 1A:
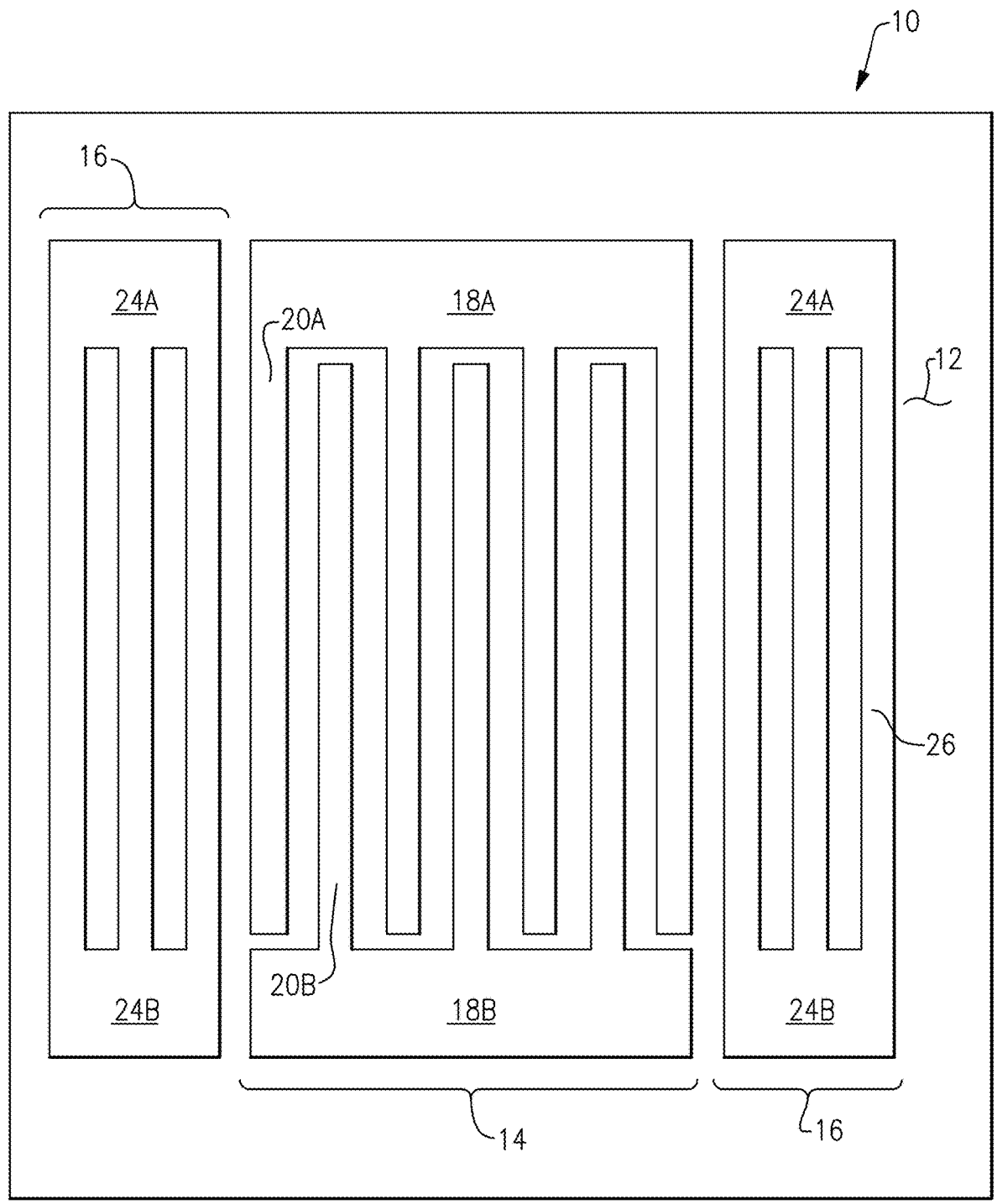
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
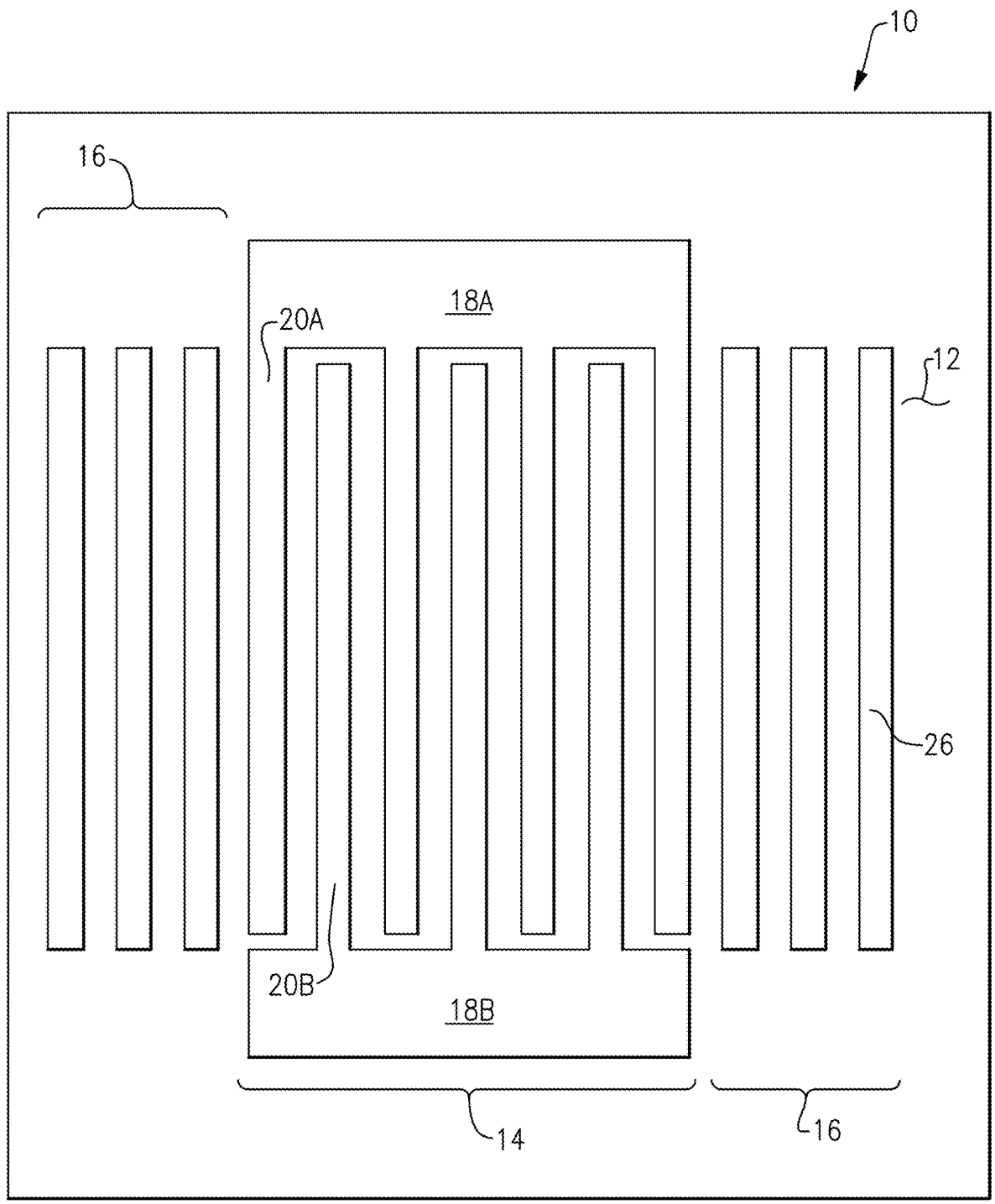
FIG. 1B is a simplified plan view of another example of a surface acoustic wave resonator.
Figure 1C:
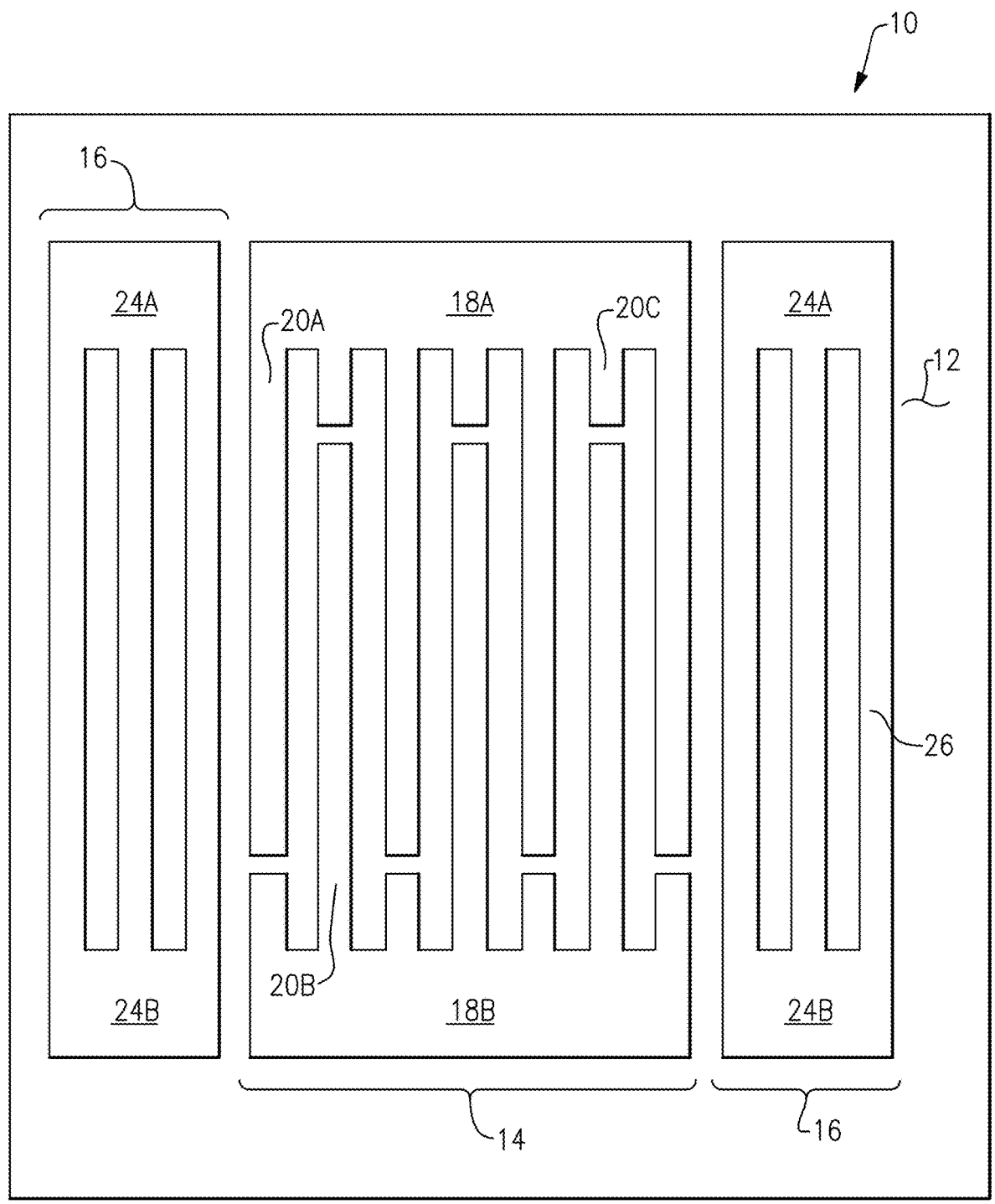
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, is are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2:
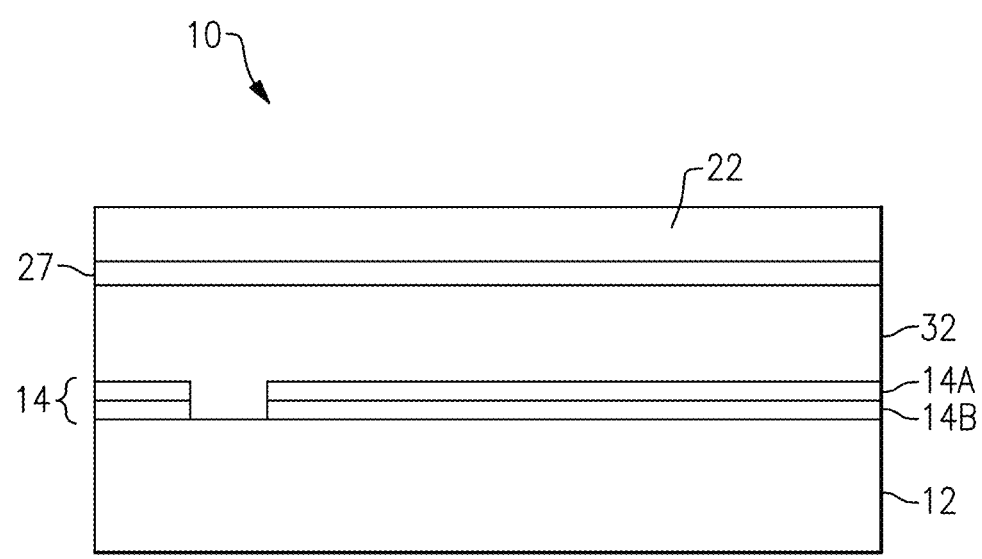
FIG. 2 is a simplified cross-sectional view of an example of a surface acoustic wave resonator.

As illustrated in FIG. 2, a layer of a dielectric 22 exhibiting a high acoustic wave velocity, for example, silicon nitride ($Si_3N_4$, also abbreviated as "SiN" herein) may be disposed over the IDT electrodes of the SAW resonator 10. In some embodiments, the layer of high acoustic wave velocity material 22 may be deposited over a dielectric material 32 having a lower acoustic wave velocity, for example, silicon dioxide ($SiO_2$) disposed over the IDT electrode structure. An intermediate layer 27 of, for example, silicon oxynitride (SiON) may optionally be disposed between the high velocity dielectric layer 22 and the lower acoustic velocity layer 32. The intermediate layer 27 may exhibit an acoustic velocity between the acoustic velocities of the layers 22 and 32.

The $SiO_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of $SiO_2$ over the IDT electrodes may thus be referred to as a temperature-compensated SAW device, or TCSAW.

As also illustrated in FIG. 2, the IDT electrodes 14 may be layered electrodes including an upper layer 14A of a highly conductive but low-density material, for example, aluminum (Al), and a lower layer 14B of a more dense material, for example, molybdenum (Mo), tungsten (W), copper (Cu), gold (Au), silver (Ag), platinum (Pt), ruthenium (Ru), or iridium (Jr). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity.

Generally, an acoustic wave resonator such as a SAW resonator will heat up during operation. As the SAW resonator heats up, the piezoelectric substrate 12, among other features of the resonator, will tend to expand. Materials typically used for piezoelectric substrates of SAW resonators generally have low thermal conductivities, for example, about 0.06 W/cm·K for lithium niobate, so the heat generated during operation of conventional SAW resonators does not readily dissipate. The expansion of the piezoelectric substrate 12, as well as other features of the resonator, will cause operating parameters, for example, resonant frequency of the resonator to change. Changes to the operating parameters of a SAW resonator will in turn result in changes to the operating parameters of a device, for example, an RF filter that includes the SAW resonator. Such changes in operating parameters of a SAW resonator or device including the SAW resonator with temperature are generally undesirable.

Materials typically used for piezoelectric substrates of SAW resonators are generally fragile and can easily fracture if not gently handled during processing to form resonator structures or during post-production handling.

It may thus be desirable to provide a solution to decrease the amount by which the features, for example, the substrate, of a SAW resonator change with changes in temperature and/or increase the rate at which heat may be removed from the SAW resonator. Such a solution may be further desirable if it increases the mechanical robustness of the SAW resonator and/or reduces the tendency of the piezoelectric substrate to fracture due to improper handling.

In accordance with various aspects and embodiments disclosed herein, a material having a lower coefficient of linear expansion and/or a higher thermal conductivity and/or a higher toughness or mechanical strength may be bonded to a piezoelectric substrate prior to or after fabrication of SAW resonators on the piezoelectric substrate. This material may both increase the mechanical robustness of the piezoelectric substrate during fabrication of SAW resonators on the substrate and increase manufacturing yield as well as reduce the amount by which operating parameters of the SAW resonators formed on the piezoelectric substrate change with temperature during operation.

As illustrated in FIG. 3, one example of a material that may be bonded to a piezoelectric substrate for SAW resonators may be silicon (Si). The silicon may be provided in the form of a wafer that is bonded to the lower surface of a wafer of piezoelectric material opposite the upper surface of the wafer of piezoelectric material upon which features of SAW resonators, such as IDT electrodes and reflector electrodes, as well as other circuitry, for example, conductive traces, passive devices, etc., may be formed. The silicon may be bonded to the piezoelectric material via a direct fusion bond or with an adhesive, for example, a thin layer of silicon dioxide. In some embodiments, a layer of silicon dioxide may be gown or deposited on the lower surface of the piezoelectric material and a layer of silicon dioxide may be gown or deposited on the upper surface of the silicon material. The piezoelectric material and silicon may then be joined by anodic bonding or other methods of joining layers of silicon dioxide known in the art.

The silicon layer may be a continuous layer. The silicon layer may be present on the lower surface of the piezoelectric material layer under all areas where SAW resonators and/or additional circuitry is formed on the piezoelectric material layer. A substrate including a piezoelectric material layer bonded to a layer of material such as silicon as illustrated in FIG. 3 may be referred to as a multilayer piezoelectric substrate (MPS) herein.

Silicon has mechanical and thermal properties that may benefit SAW resonator structures when bonded to the piezoelectric substrate of the SAW resonator structures as illustrated in FIG. 3. The thermal coefficient of expansion of silicon is about 2.6 ppm/° K which is significantly lower than that of conventional materials used as piezoelectric substrates in SAW resonator structures such as lithium niobate (from about 7.5 ppm/° K to 15.4 ppm/° K, depending on crystallographic direction). Silicon has a thermal conductivity of about 1.3 W/cm·K, more than 20 times the 0.06 W/cm·K thermal conductivity of lithium niobate. Silicon is also significantly less fragile than lithium niobate. These properties lead to the improvements presented in FIG. 3 when silicon is bonded to the bottom of a lithium niobate substrate for a SAW resonator structure. Bonding the silicon to the bottom of the lithium niobate substrate may, in some examples, reduce the temperature coefficient of frequency (TCF) of the SAW resonator at the resonant frequency (fs) from about −33 ppm to about −23 ppm and at the anti-resonant frequency (fp) from about −22 ppm to about −12 ppm. Mechanical robustness, and thus wafer handling, of the lithium niobate/silicon multilayer substrate is improved relative to that of the lithium niobate substrate without the bonded silicon. Heat dissipation of the lithium niobate/silicon substrate is improved relative to that of the lithium niobate substrate without the bonded silicon. Operating parameters of the SAW resonator such as quality factor Q and coupling coefficient K2 are unaffected by the bonding of the silicon to the lower surface of the piezoelectric substrate. In FIG. 3, Q is the low band ("LB") quality factor—the quality factor at frequencies of about 1 GHz and below.

It should be appreciated that SAW resonator structures as disclosed herein may benefit from bonding of materials other than silicon to the lower surface of the piezoelectric substrate. Other high impedance material substrates, for example, aluminum nitride, silicon nitride, magnesium oxide spinel, magnesium oxide crystal, sapphire, etc. may be utilized instead of silicon. Further, the piezoelectric substrate is not limited to lithium niobate but may be other piezoelectric materials, for example, lithium tantalate or another piezoelectric material in different examples. Additionally, although the figures presented herein indicate 128 degree rotated lithium niobate, lithium niobate with other crystallographic orientations may alternatively be utilized as the substrate material.

In FIG. 3, the thickness of the lithium niobate portion of the combined lithium niobate/silicon multilayer substrate is indicated as 5λ, λ being the wavelength of the main acoustic wave excited by the SAW resonator, which in the example illustrated is 4 μm (5λ=20 μm). Generally, the thickness of the lithium niobate layer should be greater than 1λ to facilitate proper operation of the SAW resonator. The silicon layer may be thicker than the lithium niobate layer, for example, about 350 μm in some examples, although this thickness should not be considered limiting. Other examples may have lithium niobate or silicon thickness greater than or lesser than these values.

Figure 4A:
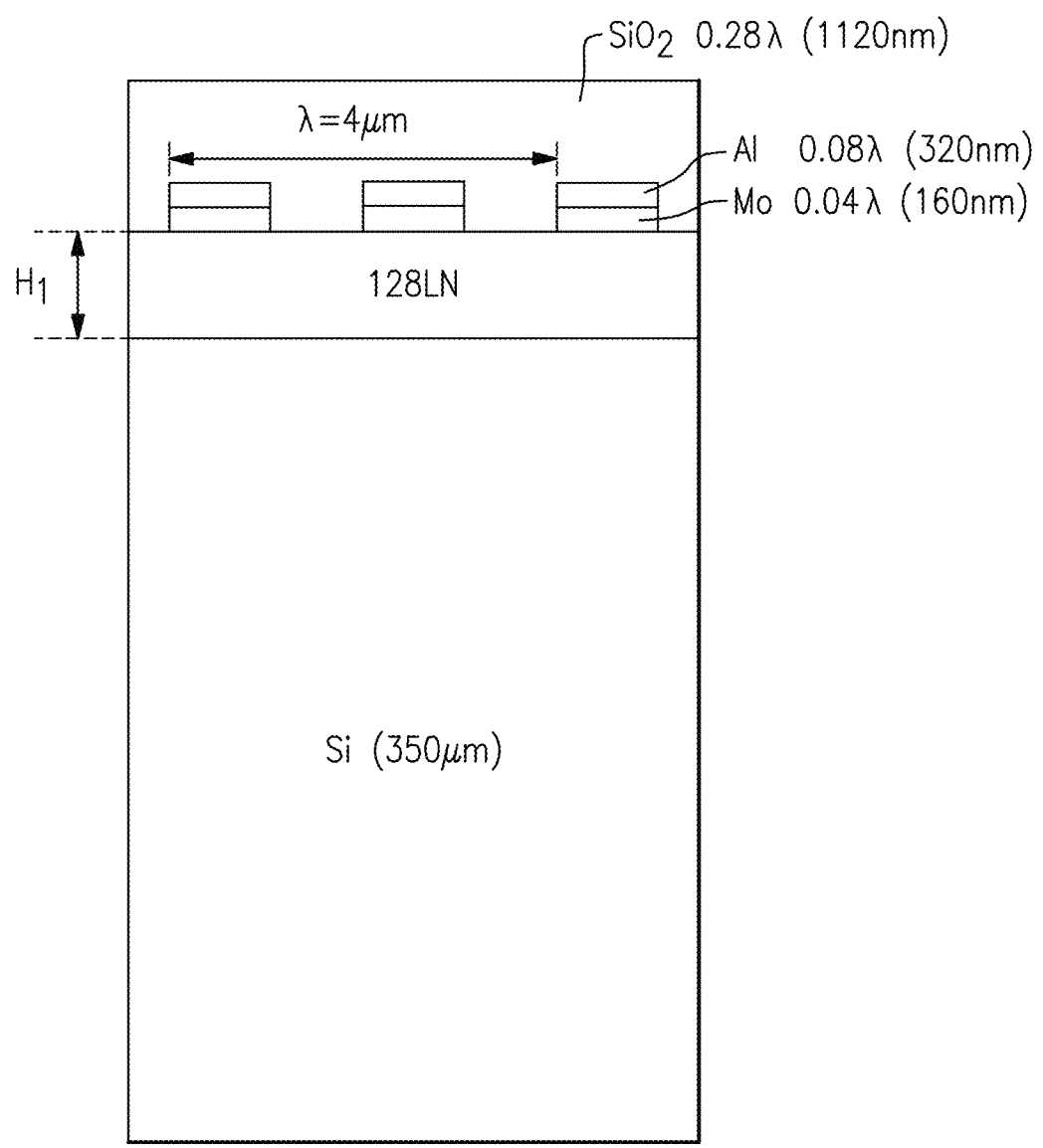
FIG. 4A illustrates a partial cross-sectional view of an example of a SAW resonator formed on a multilayer piezoelectric substrate including a layer of lithium niobate disposed on a layer of silicon.
Figure 4B:
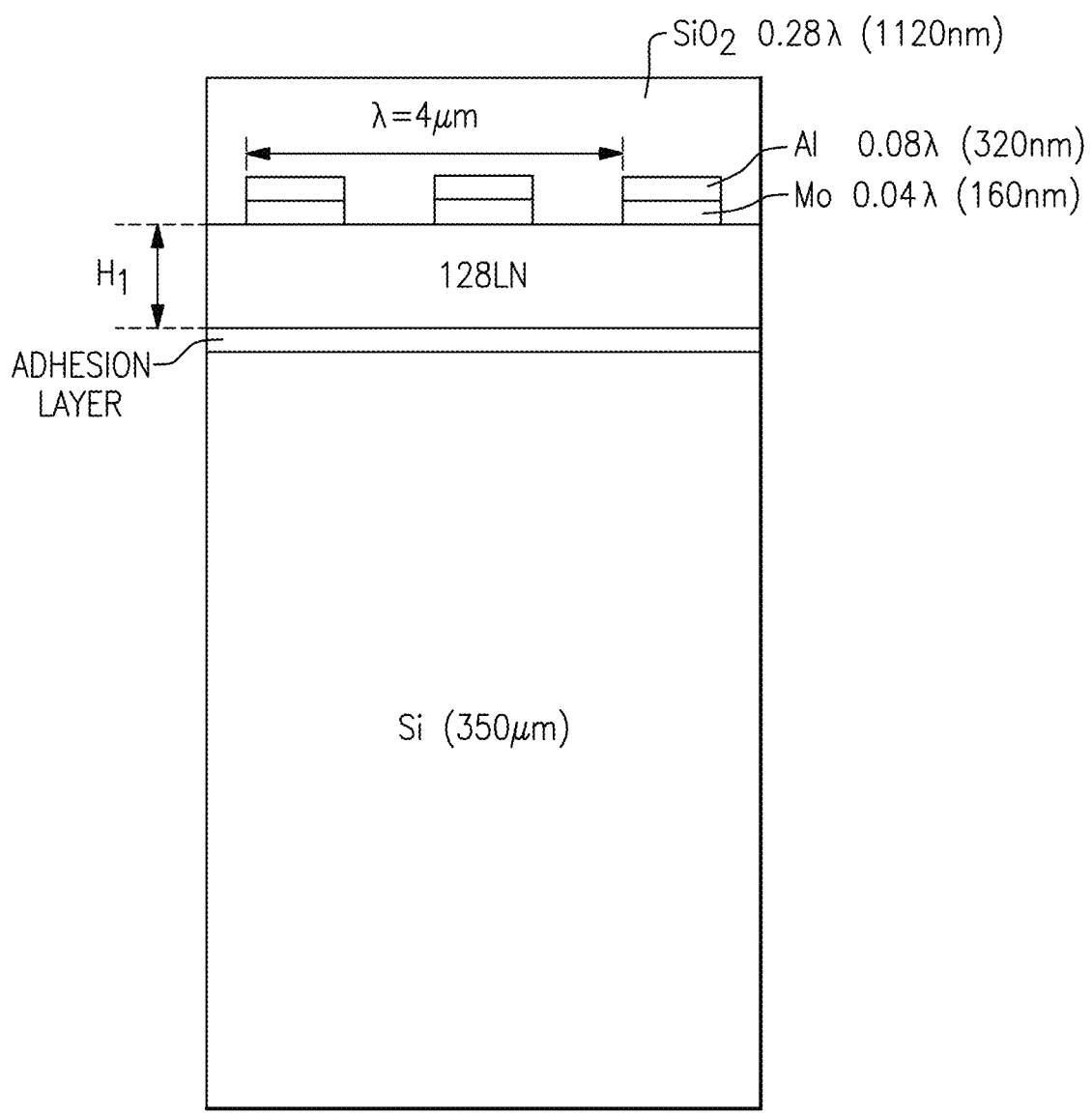
FIG. 4B illustrates a partial cross-sectional view of another example of a SAW resonator formed on a multilayer piezoelectric substrate including a layer of lithium niobate disposed on a layer of silicon.
Figure 4C:
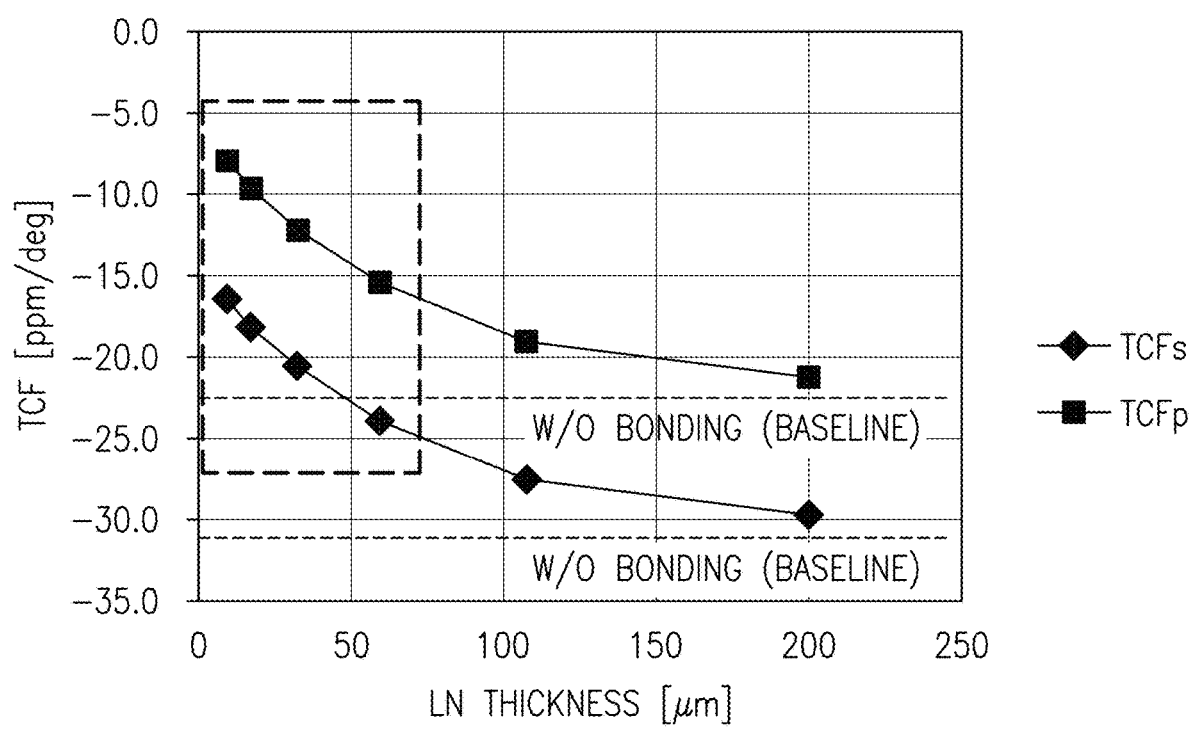
FIG. 4C illustrates changes in the temperature coefficient of frequency of the SAW resonator of FIG. 4A with changes in thickness of the lithium niobate layer.

The relative thicknesses of the silicon layer and the piezoelectric material layer may affect properties of the multilayer piezoelectric substrate including the two materials, for example, the thermal coefficient of frequency of the multilayer piezoelectric substrate. As discussed above, silicon has a lower coefficient of thermal expansion than piezoelectric materials such as lithium niobate. Bonding a layer of silicon to a layer of lithium niobate to form a multilayer piezoelectric substrate may thus restrain the change in dimensions of the lithium niobate layer with changes in temperature and help stabilize the properties of the multilayer piezoelectric substrate with respect to changes in temperature as compared to a lithium niobate substrate without a bonded silicon layer. The thicker the silicon layer as compared to the thickness of the lithium niobate layer, the more the silicon layer may stabilize the properties of the multilayer piezoelectric substrate with respect to changes in temperature. In one example, simulations of the temperature coefficient of frequency at both the resonant frequency (TCFs) and anti-resonant frequency (TCFp) for different thickness Hi of the lithium niobate layer were performed for a SAW resonator structure as illustrated in FIG. 4A. The structure as simulated included a silicon layer thickness of 350 nm and a silicon dioxide layer thickness of 1120 nm. The results of the simulation are illustrated in FIG. 4C. The absolute value of TCF at both the resonant and anti-resonant frequencies of the structure decreased significantly (became significantly less negative) for lithium niobate thicknesses Hi less than about 75 μm, with a lesser reductions in the absolute values of the TCF parameters with thicker lithium niobate layers. All the simulated TCF values were above what would be expected for a lithium niobate substrate without a bonded silicon layer (baseline lines in FIG. 4C).

The structure illustrated in FIG. 4A includes a layer of silicon directly bonded to a layer of lithium niobate to form the multilayer piezoelectric substrate. The bond between the layers of silicon and lithium niobate may be a fusion bond or a covalent bond. In other embodiments, for example, as illustrated in FIG. 4B an adhesive material, for example, $SiO_2$ or a metal may be disposed between the layers of silicon and lithium niobate to bond the two.

Figure 5A:
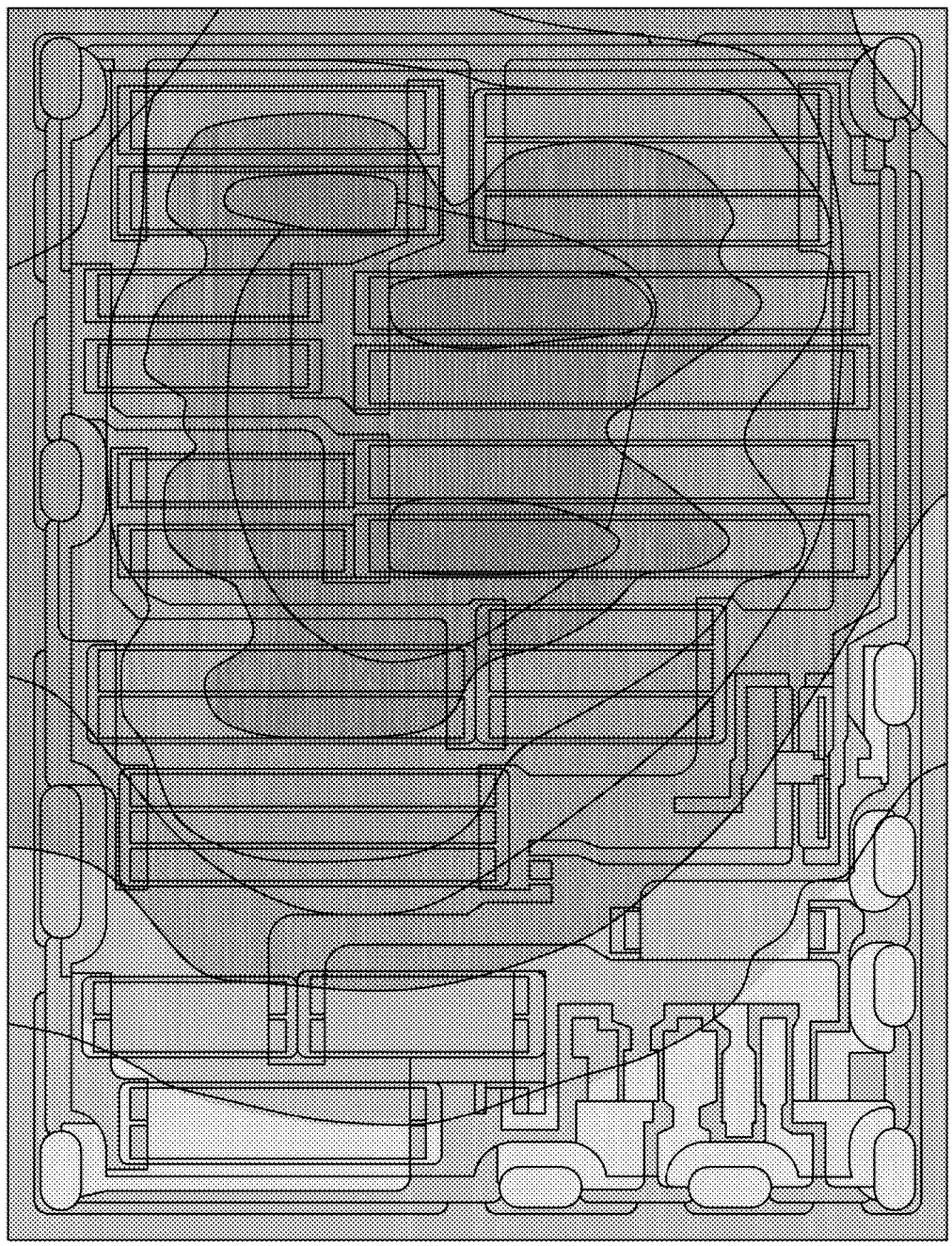
FIG. 5A illustrates the temperature distribution across a die including SAW filters formed on a lithium niobate substrate.
Figure 5B:
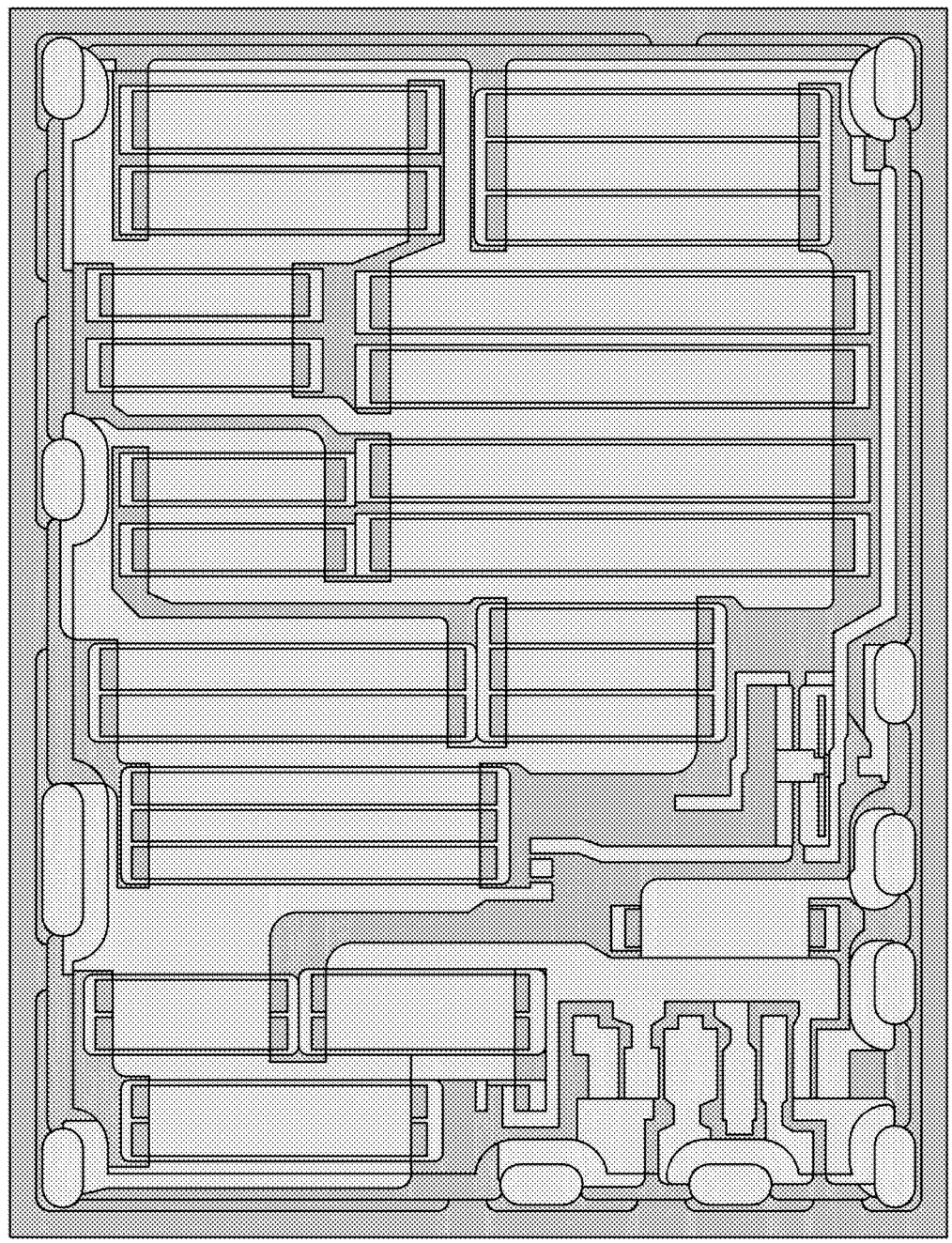
FIG. 5B illustrates the temperature distribution across a die including SAW filters formed on a multilayer piezoelectric substrate including a layer of lithium niobate disposed on a layer of silicon.

Simulations were also performed to determine a difference in temperature rise of an example of a multilayer piezoelectric substrate die as disclosed herein with a plurality of SAW resonators vs. a similar die with a substrate including only lithium niobate when operated with a power level of 1 W. The results are indicated in Table 1 below and in FIGS. 5A (baseline TCSAW) and 5B (MPS).

TABLE 1

| Structure | Heat Conductivity (W/m · K) | Max chip temperature (° C.) |
|---|---|---|
| TCSAW (LN) | 6.01 | 89 |
| MPS | 140 | 36 |

As illustrated, the die with the conventional lithium niobate substrate exhibited a much greater rise in temperature than the die with the MPS substrate. The MPS substrate would thus be more effective than the conventional lithium niobate substrate at maintaining a die including SAW resonators at a temperature below which the circuitry on the die might fail. The MPS substrate would also thus improve the reliability and lifetime of the die as compared to a similar die but with a conventional lithium niobate substrate due to the reduction in extremes of thermal cycling which might otherwise lead to electromigration of conductors in the die, cracking of the substrate, etc.

Figure 6A:
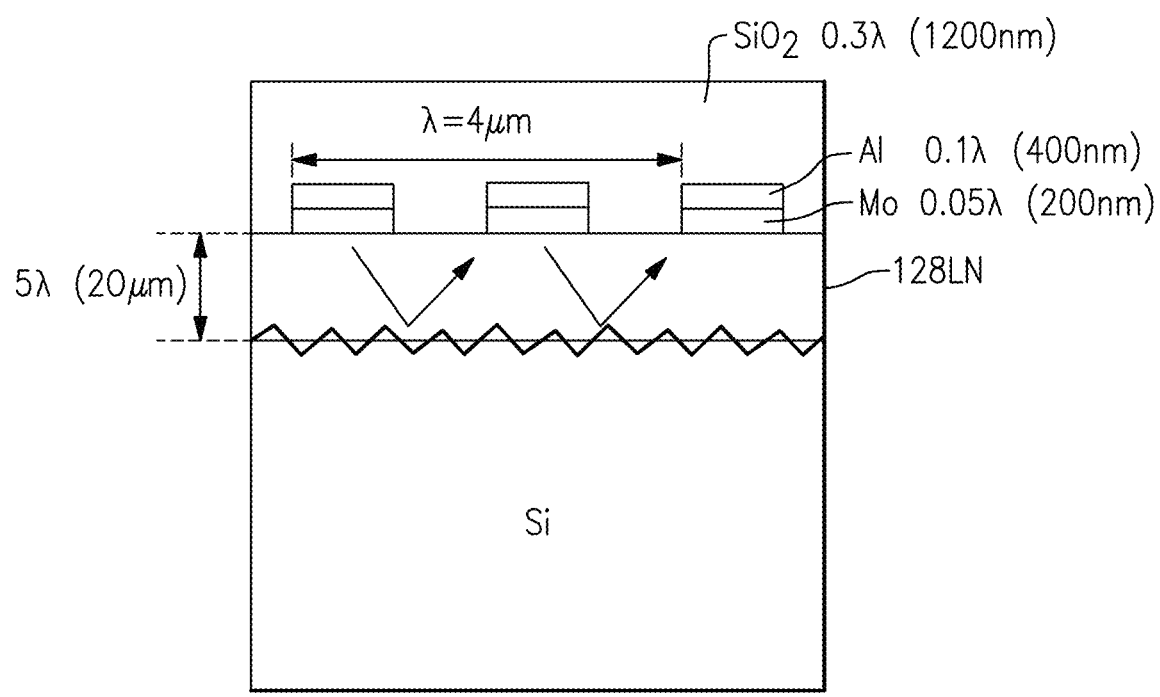
FIG. 6A is a partial cross-section of a SAW resonator formed on a multilayer piezoelectric substrate including a layer of lithium niobate disposed on a layer of silicon and including a roughened interface between the layer of lithium niobate and the layer of silicon.
Figure 6B:
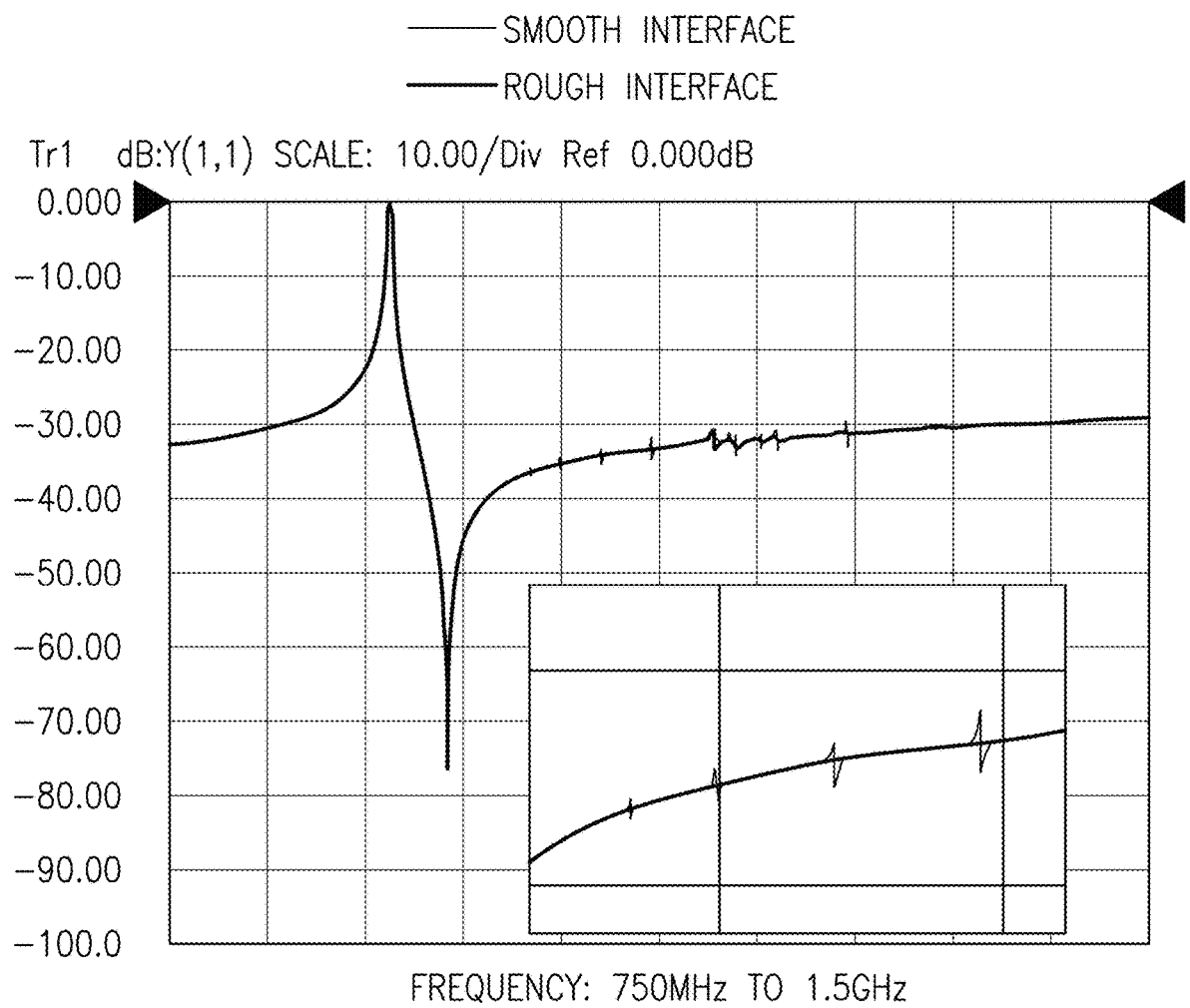
FIG. 6B illustrates how the roughened interface reduces spurious signals in the complex transmittivity curve of the SAW resonator of FIG. 6A.
Figure 6C:
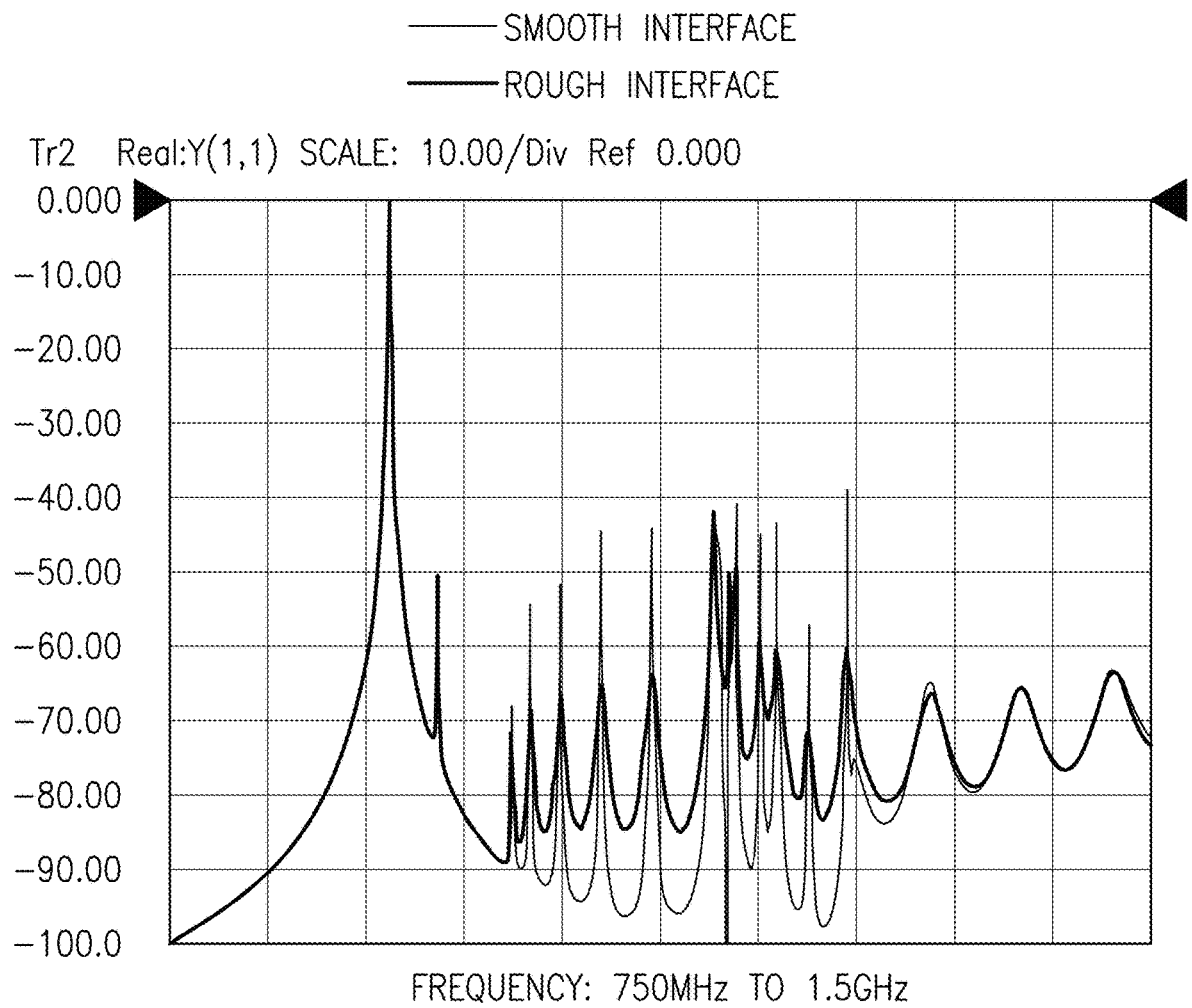
FIG. 6C illustrates how the roughened interface reduces spurious signals in the real transmittivity curve of the SAW resonator of FIG. 6A.

In some embodiments, acoustic waves may reflect from the interface between the piezoelectric material (e.g., lithium niobate) and the silicon layer in a multilayer piezoelectric substrate die and cause spurious signals to appear in the frequency response of SAW resonators formed on the substrate. In some embodiments, these spurious signals may be suppressed by roughening the interface between the piezoelectric material and the silicon layer. In some embodiments, the roughness of the interface between the piezoelectric material and the silicon layer (as well as the other surfaces or interfaces discussed below) may be about 0.05λ or more. A simulation was performed for a SAW device having the structure illustrated in FIG. 6A with both a smooth interface between the lithium niobate layer and the silicon layer and a roughened interface between the lithium niobate layer and the silicon layer. The results of the simulations of the frequency response of the complex admittance of the SAW filter is illustrated in FIG. 6B, including an enlarged image of a portion of the frequency response curve, and the results of the simulations of the frequency response of the real portion of the admittance of the SAW filter is illustrated in FIG. 6C. As can be seen, spurious signals in the frequency response curves were suppressed in the simulation of the SAW structure including the roughened interface as compared to the SAW structure including the smooth interface.

Figure 7A:
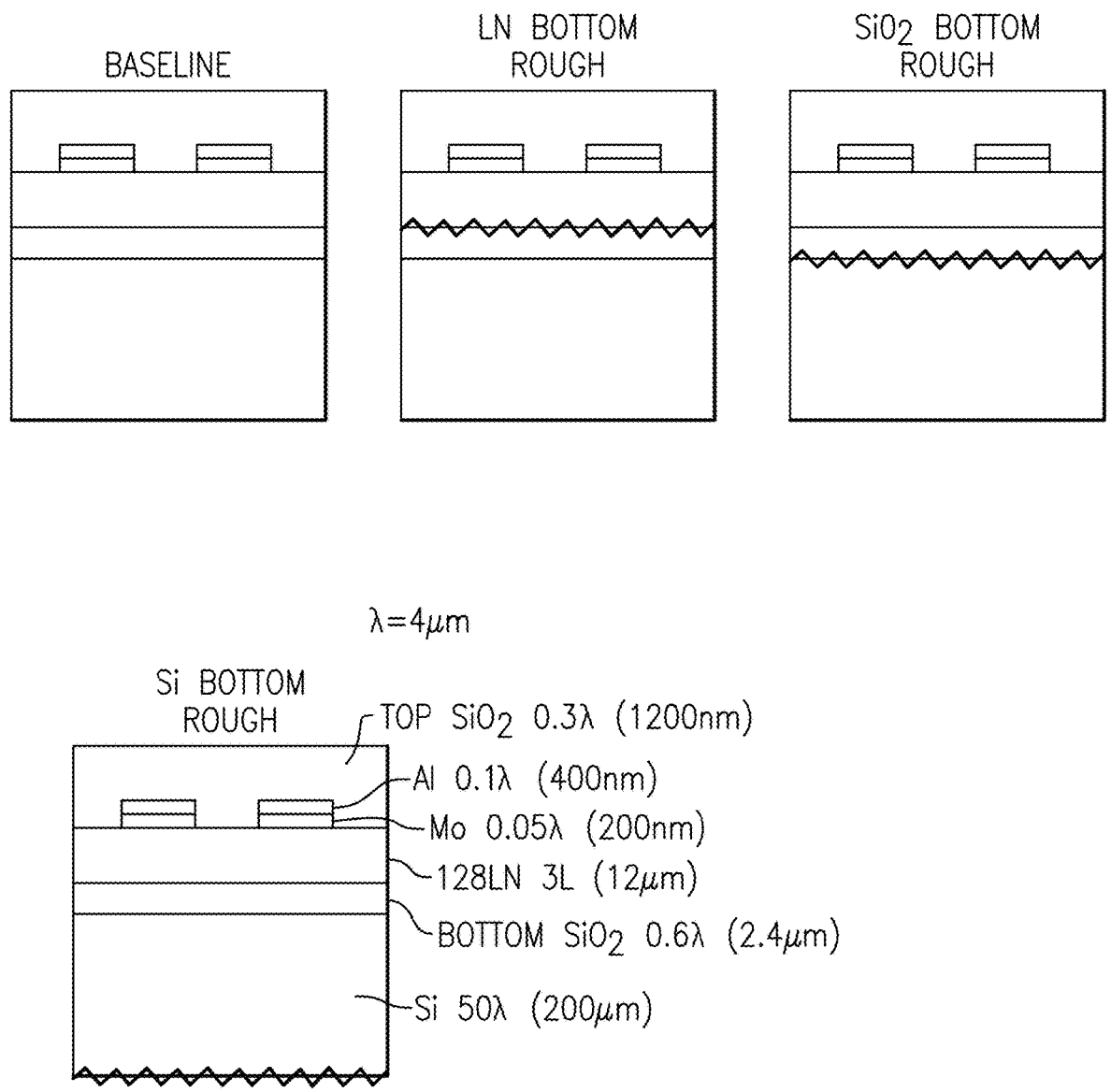
FIG. 7A illustrates partial cross-sections of SAW resonators formed on multilayer piezoelectric substrates including a layer of lithium niobate disposed on a layer of silicon dioxide which is in turn disposed on a layer of silicon and including smooth or roughened surfaces of the different material layers.
Figure 7B:
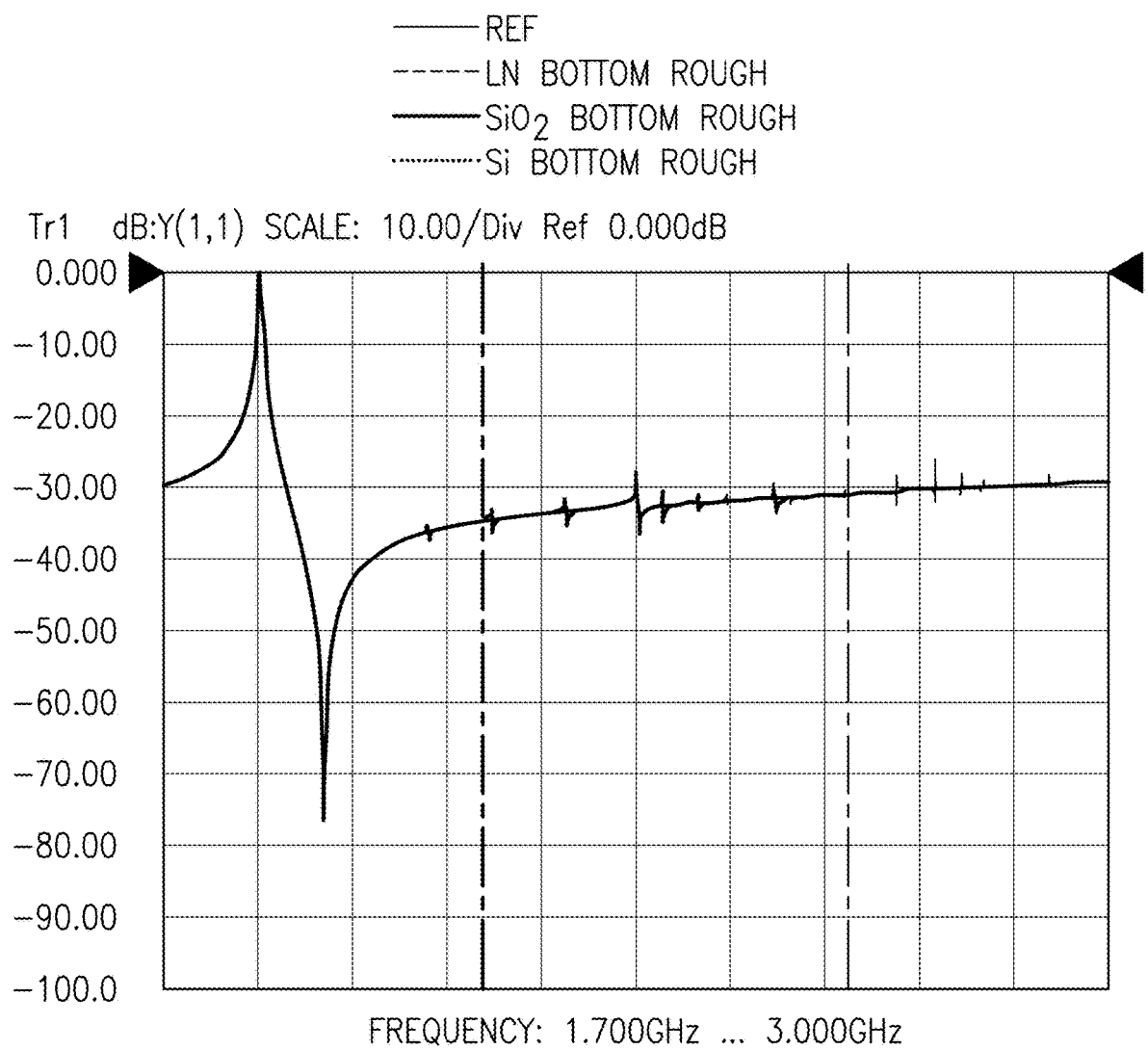
FIG. 7B illustrates how the different roughened surfaces affect spurious signals in the complex transmittivity curves of the different examples of SAW resonators in FIG. 7A.
Figure 7C:
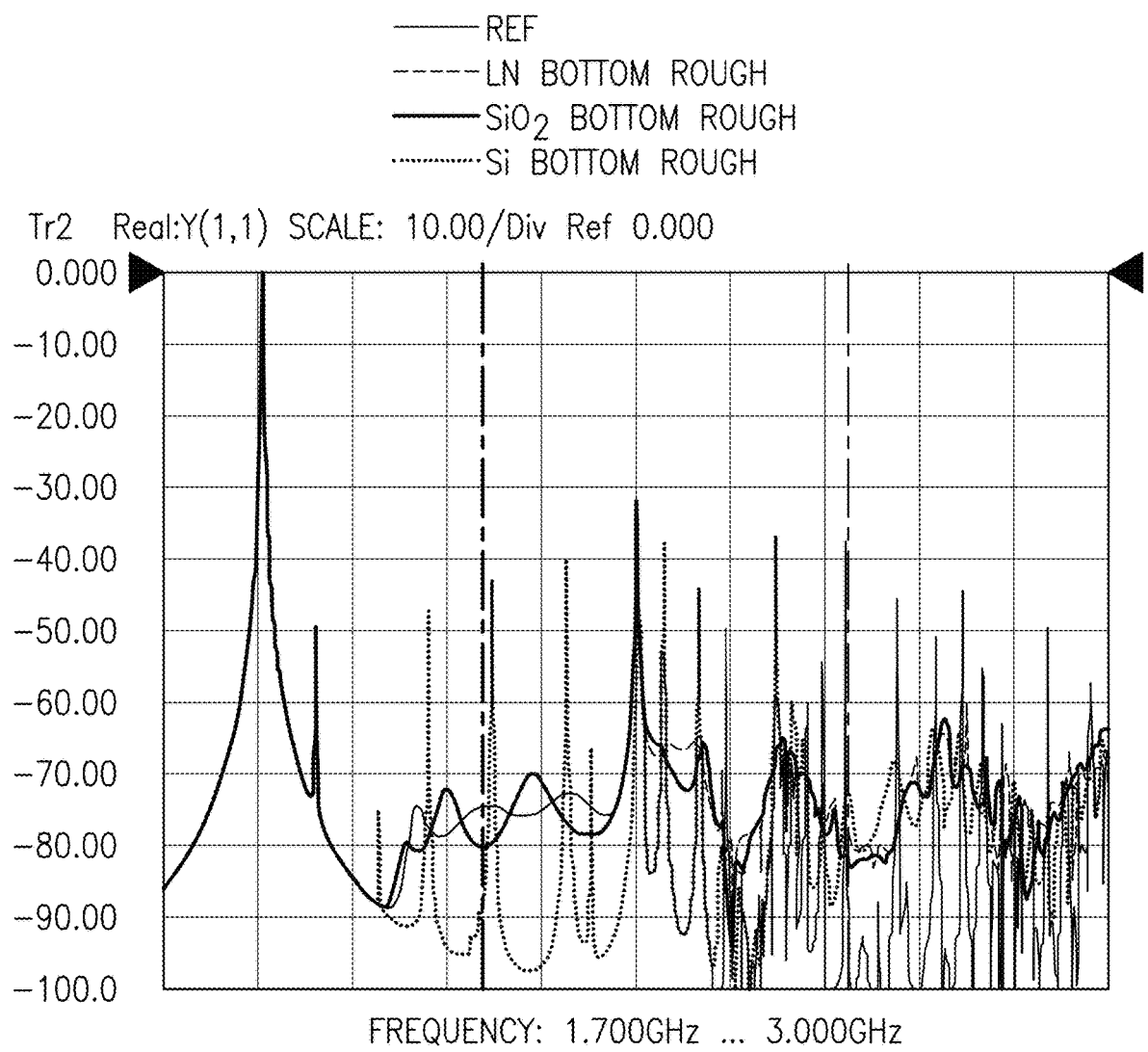
FIG. 7C illustrates how the different roughened surfaces affect spurious signals in the real transmittivity curves of the different examples of SAW resonators in FIG. 7A.

Additional simulations were performed to determine the effect of the location of the roughened interface on the frequency response of a SAW device including a bottom silicon dioxide layer disposed between the silicon and lithium niobate layers. Four different configurations were simulated. These configurations are illustrated in FIG. 7A and include a baseline configuration with smooth interfaces between the silicon, bottom silicon dioxide, and lithium niobate layers and a smooth lower silicon surface, a configuration with a roughened interface between the lithium niobate and bottom silicon dioxide layers, a configuration with a roughened interface between the bottom silicon dioxide and silicon layers, and a configuration with a roughened lower surface of the silicon layer. The thicknesses of the various layers in each configuration are the same and are indicated with respect to the configuration with a roughened lower surface of the silicon layer. The results of the simulations of the frequency response of the complex transmittivity of the SAW filter are illustrated in FIG. 7B, and the results of the simulations of the frequency response of the real transmittivity of the SAW filter are illustrated in FIG. 7C. The roughened interface between the lithium niobate and bottom silicon dioxide and between the bottom silicon dioxide and silicon layers were effective to suppress higher order vibrational modes. The roughened surface of the lower surface of the silicon layer helps to suppress higher order vibrational modes above the bulk velocity of silicon, but introduces some spurious signals at lower frequencies, for example, between about 2 GHz and about 2.5 GHz. It should be appreciated that in some examples the different locations of the roughened interfaces illustrated in FIG. 7A may be combined in a single SAW structure.

Figure 8A:
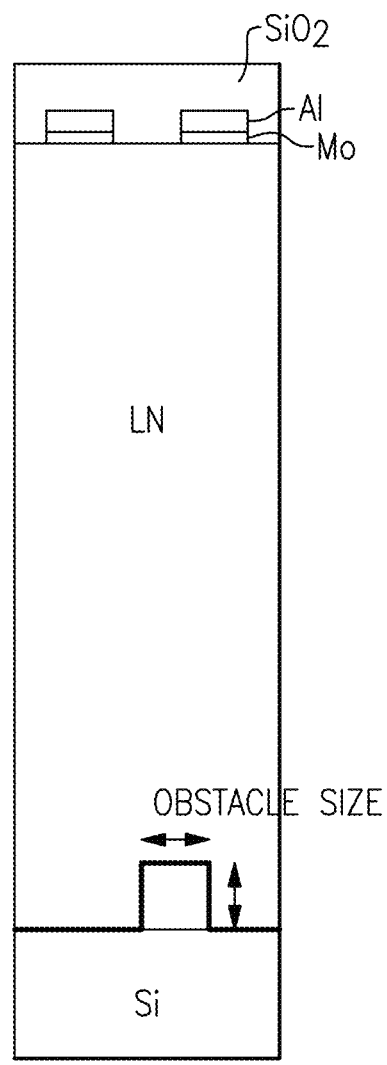
FIG. 8A illustrates a partial cross-section of a SAW resonator formed on a multilayer piezoelectric substrate including a layer of lithium niobate disposed on a layer of silicon and including obstacles on the upper surface of the silicon layer.
Figure 8B:
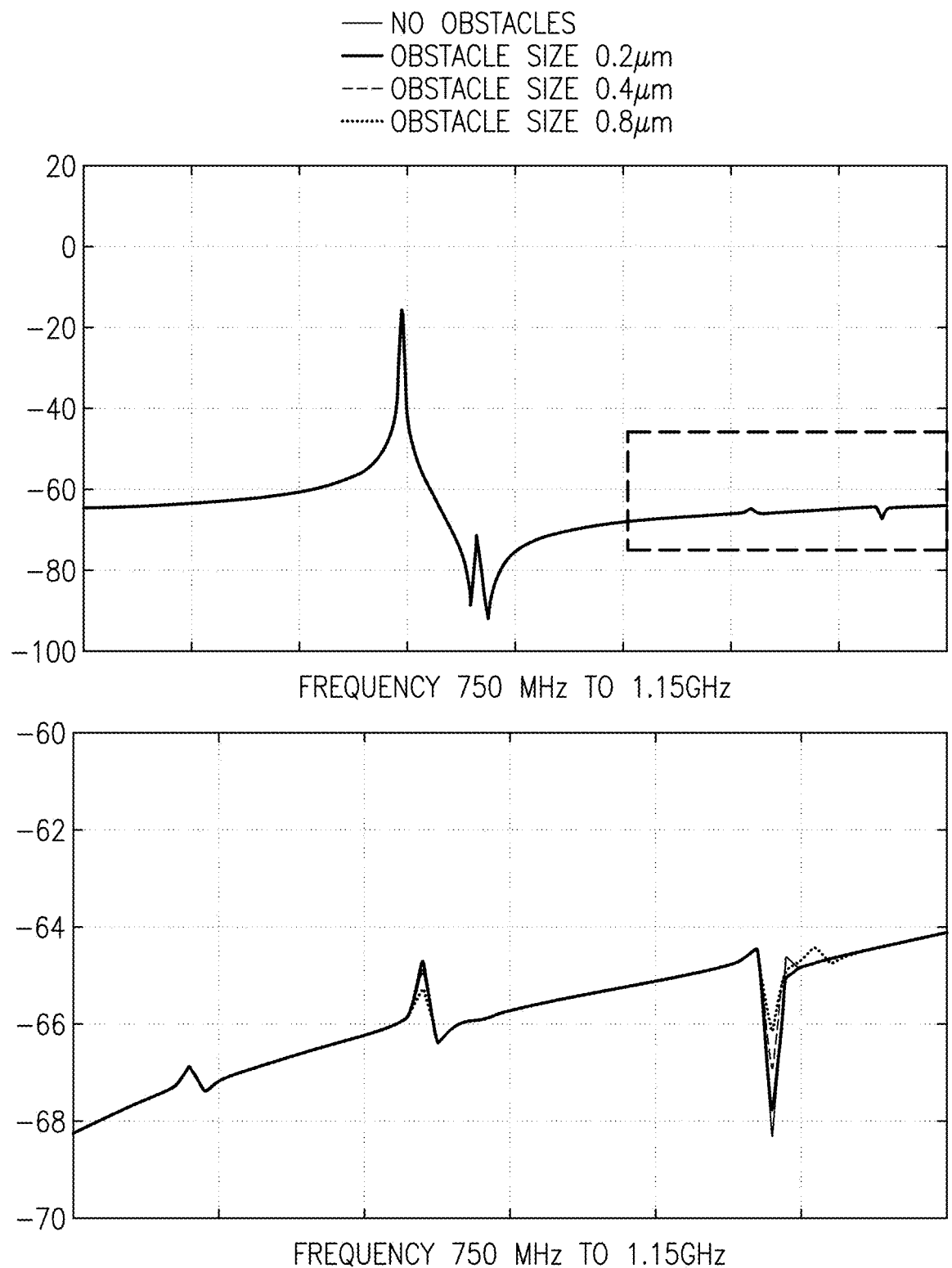
FIG. 8B illustrates the effect of differently sized obstacles on the frequency response of the SAW resonator illustrated in FIG. 8A.

Another method of suppressing spurious signals that may result from acoustic reflections from the interface between the piezoelectric material and silicon layers in SAW structures as illustrated herein may be to include small obstacles, for example, projections of the silicon into the lithium niobate layer at the interface between the silicon and lithium niobate layers. An example of a substrate structure including obstacles with square cross-sections at the lithium niobate/silicon interface is illustrated in FIG. 8A. Simulations were performed to determine the effect of these obstacles on spurious signals in the frequency response of a SAW resonator including the substrate structure illustrated in FIG. 8A. These results are shown in FIG. 8B and indicate that the obstacles improve the signal to noise ratio of the SAW resonator. The results illustrated in FIG. 8B also indicate that of the obstacle sizes simulated, obstacles having a height and width of 0.4 μm provide the best suppression of spurious signals in the frequency response of the SAW resonator. In some embodiments, distances between adjacent obstacles may be similar or the same as the characteristic sizes of the obstacles, for example, about 0.05λ or greater. It should be appreciated that in other examples obstacles having different sizes or different cross-sections, for example, rectangular or triangular cross-sections may be utilized instead of or in addition to obstacles with square cross-sections. Obstacles with sides that are not parallel to the upper surface of the piezoelectric material may prevent the reflection of bulk waves directly back upward towards the resonator electrodes. In other embodiments, the obstacles may be provided as linear structures that are non-parallel to the extension directions of the IDT electrode fingers, as a series of dots, bumps, or dimples, or as a non-periodic grating.

Figure 9A:
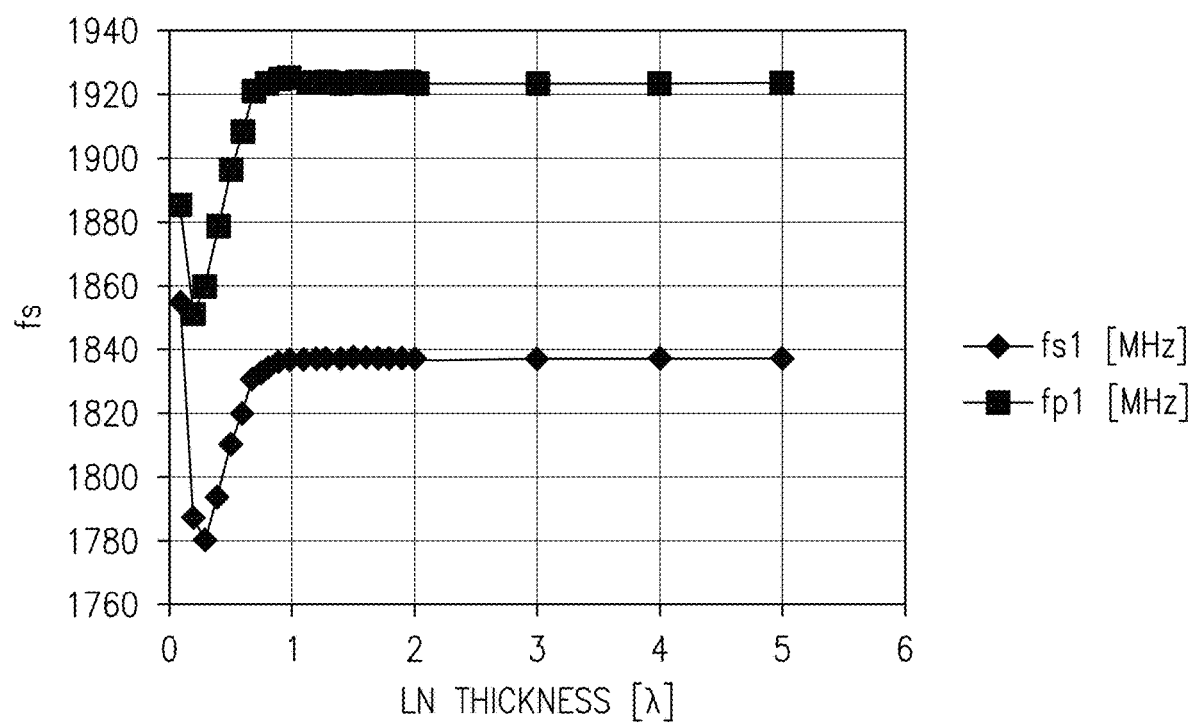
FIG. 9A illustrates the effect of lithium niobate thickness on resonant and anti-resonant frequency in a SAW resonator formed on a multilayer piezoelectric substrate including a layer of lithium niobate disposed on a layer of silicon.
Figure 9B:
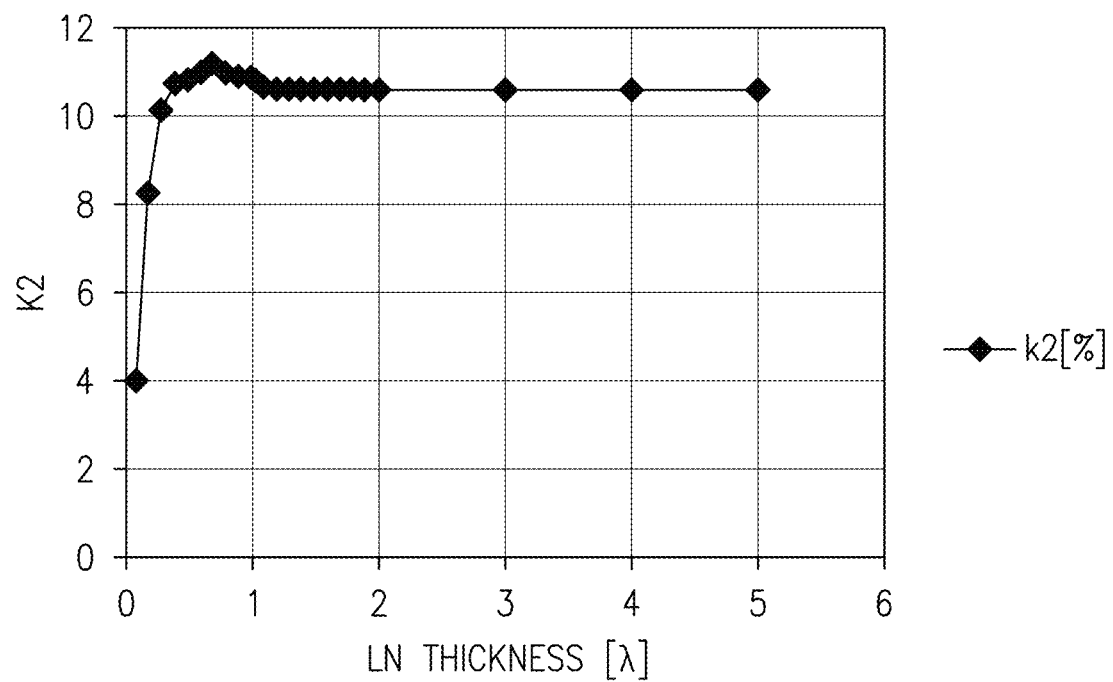
FIG. 9B illustrates the effect of lithium niobate thickness on coupling coefficient in a SAW resonator formed on a multilayer piezoelectric substrate including a layer of lithium niobate disposed on a layer of silicon.

Simulations were carried out to determine the effect of thickness of the lithium niobate layer on electrical parameters of a SAW device having a multilayer piezoelectric substrate with a structure as illustrated in FIG. 4A. FIG. 9A illustrates the effect of lithium niobate layer thickness on the resonant frequency (fs1) and anti-resonant frequency (fp1) of an example of SAW device having a multilayer piezoelectric substrate with a structure as illustrated in FIG. 4A. FIG. 9B illustrates the effect on coupling coefficient K2 of an example of SAW device having a multilayer piezoelectric substrate with a structure as illustrated in FIG. 4A. FIGS. 9A and 9B illustrate that the electrical parameters vary with lithium niobate layer thicknesses of less than 1λ but saturate at lithium niobate thicknesses of 2λ or greater. These results show that the electrical parameter of SAW device having a multilayer piezoelectric substrate may be best reproduceable if the piezoelectric material layer is 2λ thick or more.

Figure 10A:
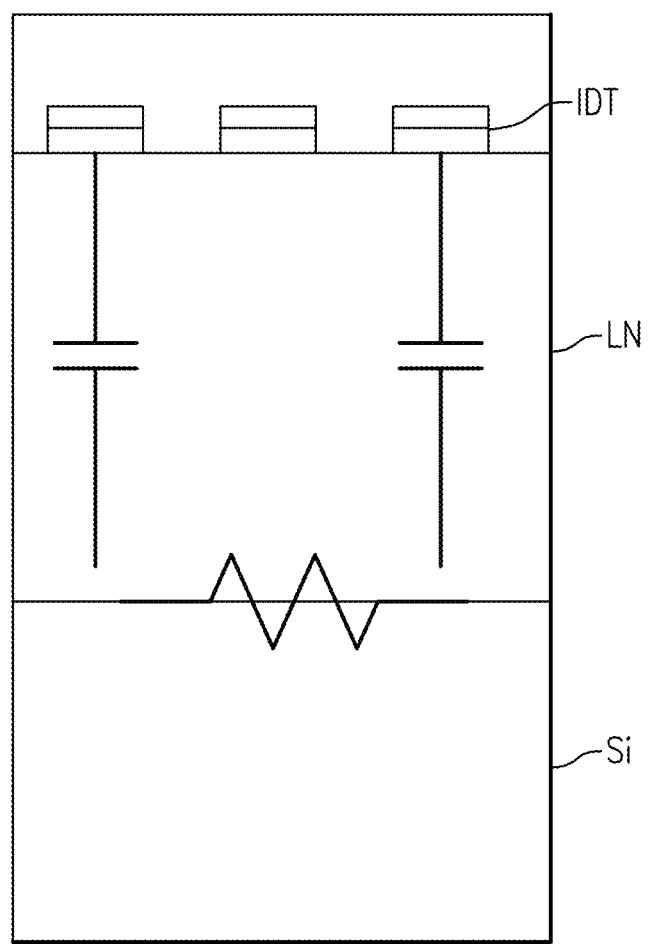
FIG. 10A illustrates parasitic capacitance between interdigital transducer electrodes and a silicon layer in a SAW resonator formed on a multilayer piezoelectric substrate including a layer of lithium niobate disposed on a layer of silicon.
Figure 10B:
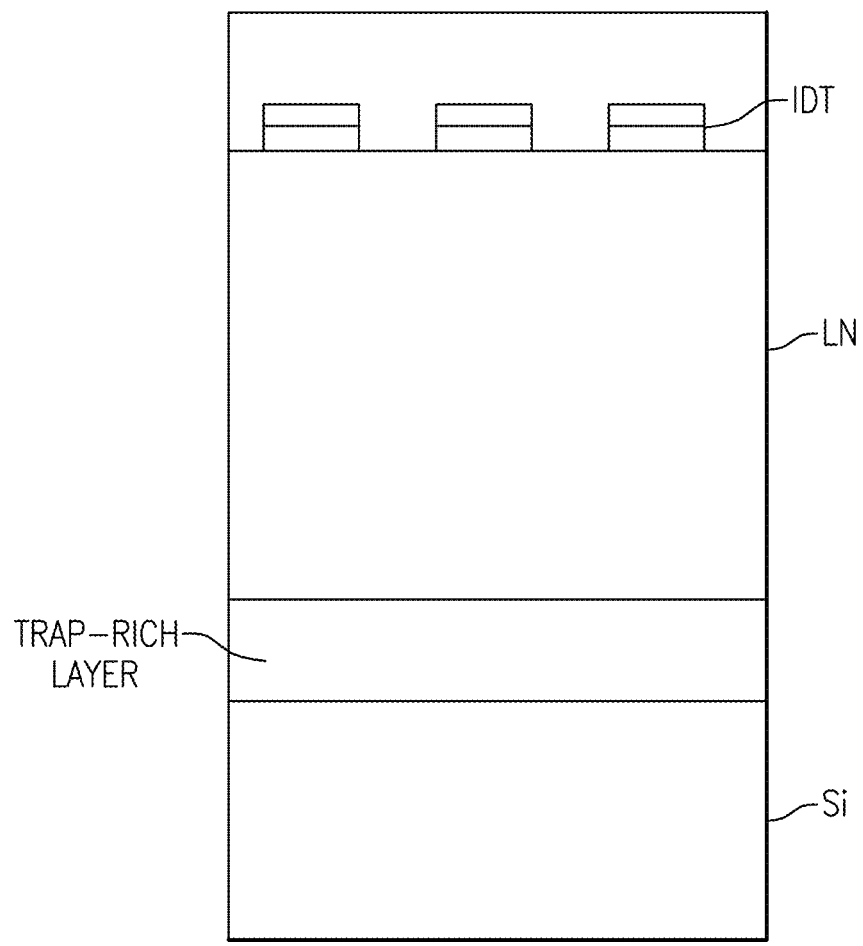
FIG. 10B illustrates a portion of a SAW resonator formed on a multilayer piezoelectric substrate including a layer of lithium niobate disposed on a layer of silicon including a trap-rich layer.
Figure 10C:
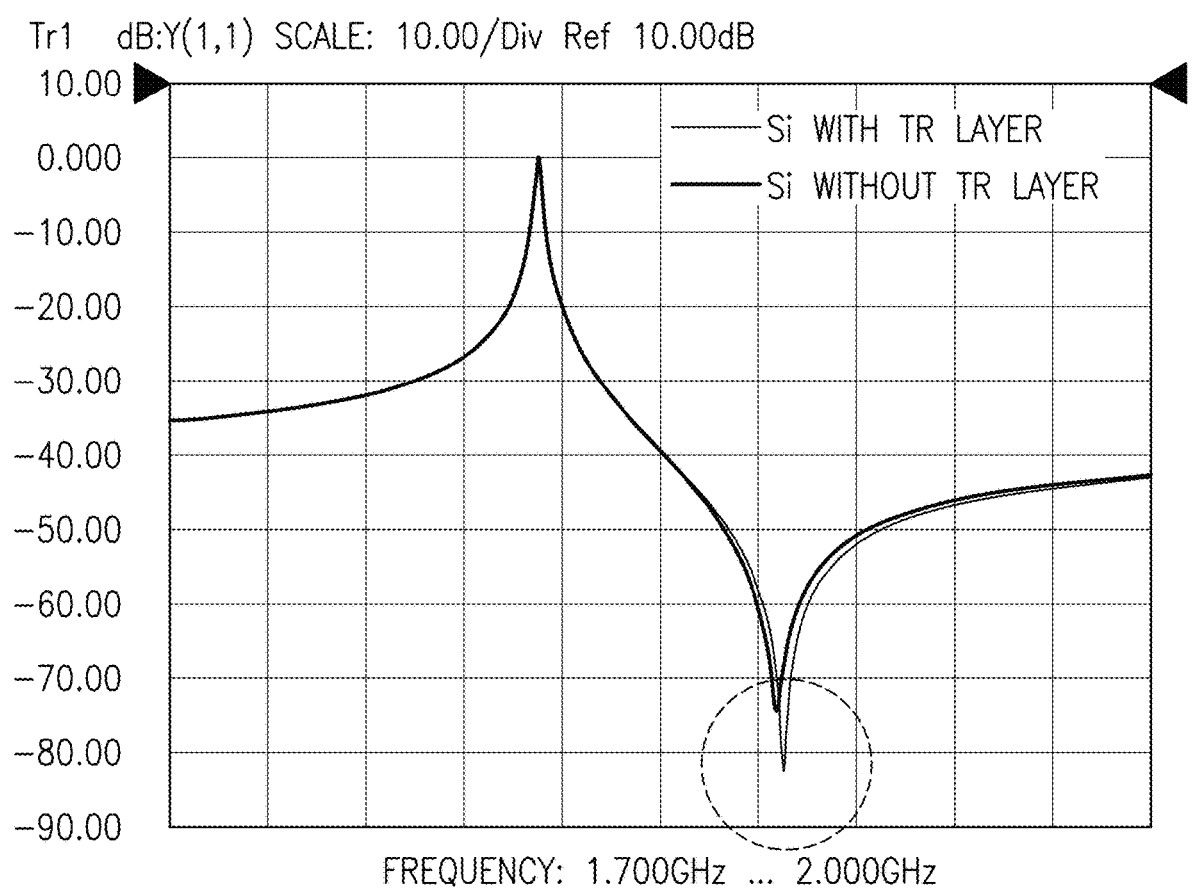
FIG. 10C illustrates the effect of forming a trap rich layer in the surface of a silicon layer on electrical parameters of a SAW resonator formed on a multilayer piezoelectric substrate including a layer of lithium niobate disposed on a layer of silicon.

One concern regarding the use of multilayer piezoelectric substrates with a lower layer of silicon as disclosed herein for SAW devices is that if the silicon is conductive, there may be a parasitic capacitance between the IDT electrodes of the SAW device and the upper surface of the silicon layer. A schematic illustrating parasitic capacitance between the IDT electrodes of a SAW device and a silicon layer in a multilayer piezoelectric substrate due to parasitic surface conductivity of the silicon is illustrated in FIG. 10A. To mitigate the parasitic surface conductivity of the silicon, a trap rich layer as illustrated in FIG. 10B may be formed in the upper surface of the silicon layer which will reduce the parasitic surface conductivity of the silicon layer. Such a trap rich layer may be formed in a number of ways, for example, by forming the surface of the silicon layer with amorphous or polycrystalline silicon, by forming the surface of the silicon layer with porous silicon, or by introducing defects into the surface of the silicon layer via ion implantation, ion milling, or other methods. Results of a simulation comparing the transmittivity curve of a SAW resonator formed on a multilayer piezoelectric substrate as disclosed herein with and without a trap rich layer formed in the silicon layer is illustrated in FIG. 10C. It can be seen from this figure that the trap rich layer improves the electrical characteristics of the SAW resonator by increasing the depth and sharpness on the anti-resonance peak.

Figure 11:
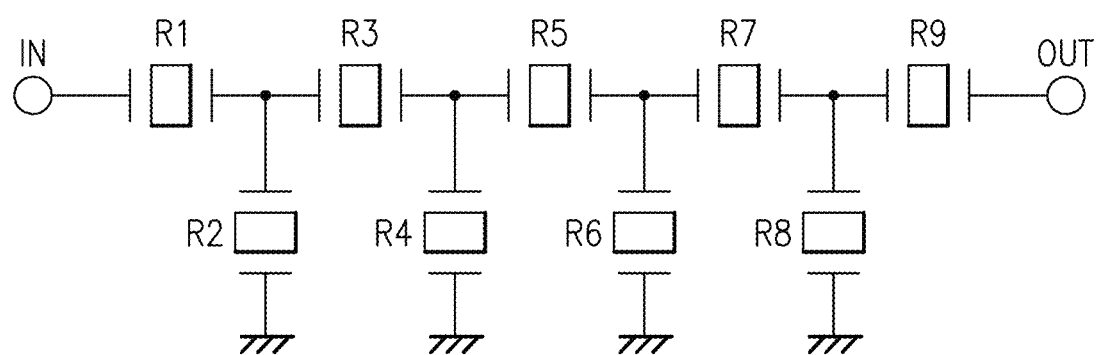
FIG. 11 is a schematic diagram of a radio frequency ladder filter.

In some embodiments, multiple SAW resonators as disclosed herein may be combined into a filter, for example, an RF ladder filter schematically illustrated in FIG. 11 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 12:
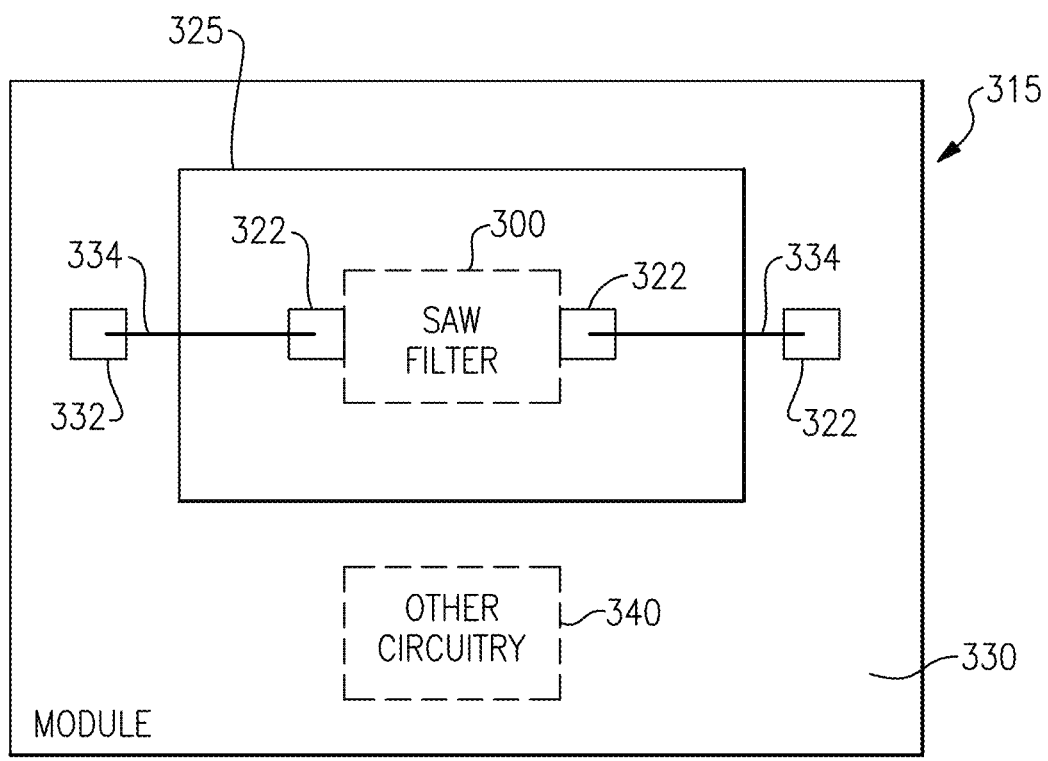
FIG. 12 is a block diagram of one example of a filter module that can include one or more acoustic wave elements according to aspects of the present disclosure.
Figure 13:
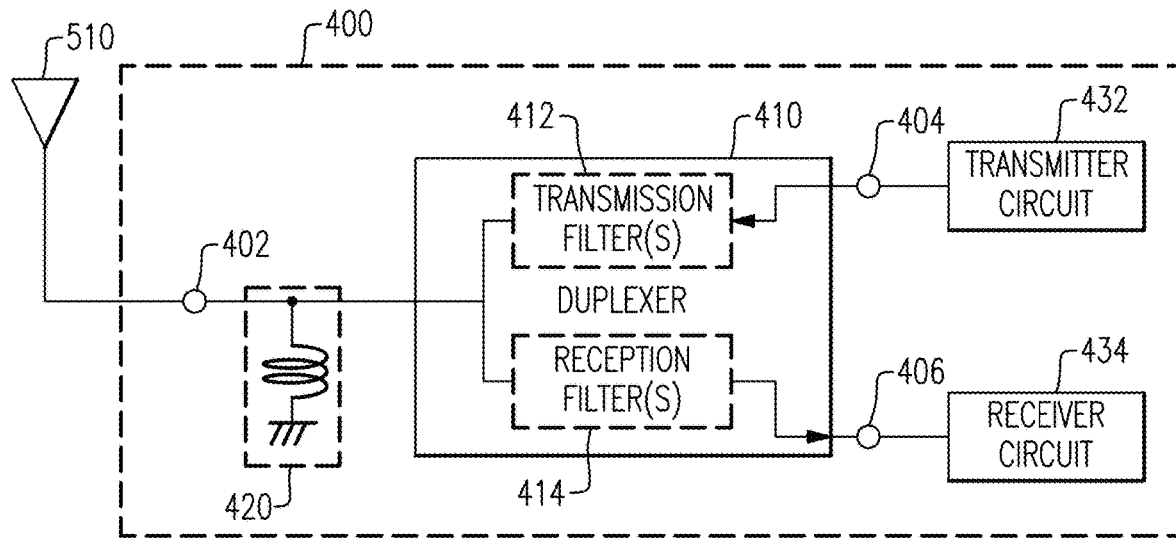
FIG. 13 is a block diagram of one example of a front-end module that can include one or more filter modules according to aspects of the present disclosure.
Figure 14:
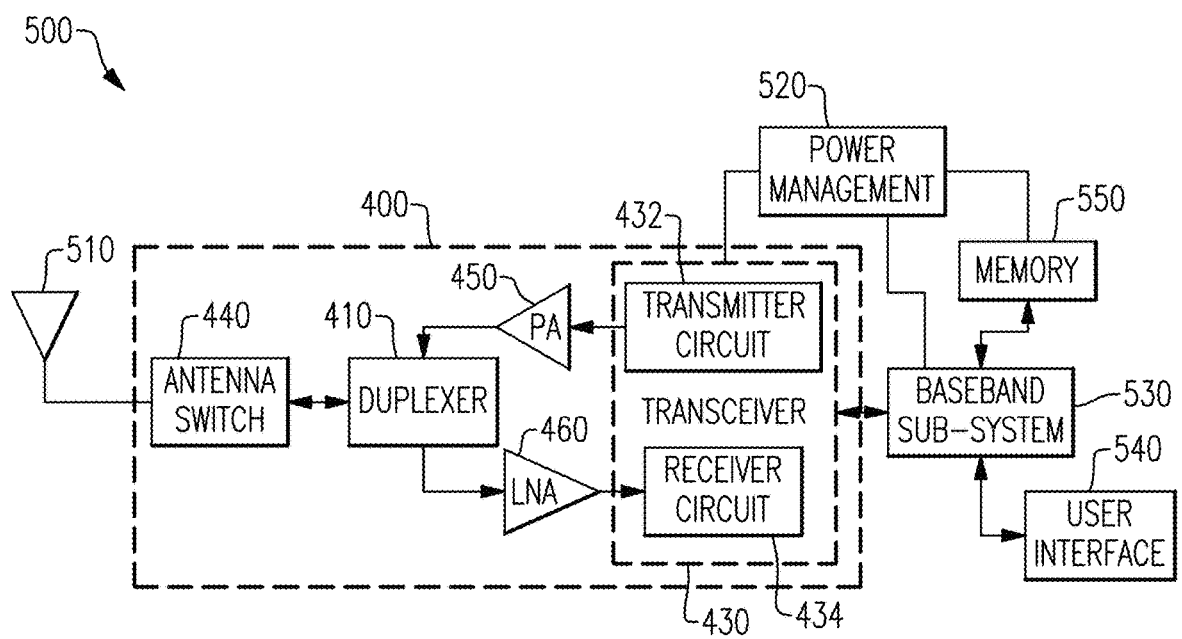
FIG. 14 is a block diagram of one example of a wireless device including the front-end module of FIG. 13.

Examples of the SAW devices, e.g., SAW resonators discussed herein can be implemented in a variety of packaged modules. Some example packaged modules will now be discussed in which any suitable principles and advantages of the SAW devices discussed herein can be implemented. FIGS. 12, 13, and 14 are schematic block diagrams of illustrative packaged modules and devices according to certain embodiments.

As discussed above, surface acoustic wave resonators can be used in surface acoustic wave (SAW) RF filters. In turn, a SAW RF filter using one or more surface acoustic wave elements may be incorporated into and packaged as a module that may ultimately be used in an electronic device, such as a wireless communications device, for example. FIG. 12 is a block diagram illustrating one example of a module 315 including a SAW filter 300. The SAW filter 300 may be implemented on one or more die(s) 325 including one or more connection pads 322. For example, the SAW filter 300 may include a connection pad 322 that corresponds to an input contact for the SAW filter and another connection pad 322 that corresponds to an output contact for the SAW filter. The packaged module 315 includes a packaging substrate 330 that is configured to receive a plurality of components, including the die 325. A plurality of connection pads 332 can be disposed on the packaging substrate 330, and the various connection pads 322 of the SAW filter die 325 can be connected to the connection pads 332 on the packaging substrate 330 via electrical connectors 334, which can be solder bumps or wirebonds, for example, to allow for passing of various signals to and from the SAW filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the SAW filter 300 can be used in a wide variety of electronic devices. For example, the SAW filter 300 can be used in an antenna duplexer, which itself can be incorporated into a variety of electronic devices, such as RF front-end modules and communication devices.

Referring to FIG. 13, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 13, however, in other embodiments these components may be integrated into a common transceiver circuit or module. As will be appreciated by those skilled in the art, the front-end module 400 may include other components that are not illustrated in FIG. 13 including, but not limited to, switches, electromagnetic couplers, amplifiers, processors, and the like.

FIG. 14 is a block diagram of one example of a wireless device 500 including the antenna duplexer 410 shown in FIG. 13. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 13. The front-end module 400 includes the duplexer 410, as discussed above. In the example shown in FIG. 14 the front-end module 400 further includes an antenna switch 440, which can be configured to switch between different frequency bands or modes, such as transmit and receive modes, for example. In the example illustrated in FIG. 14, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 13.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 14, the front-end module 400 may further include a low noise amplifier module 460, which amplifies received signals from the antenna 510 and provides the amplified signals to the receiver circuit 434 of the transceiver 430.

The wireless device 500 of FIG. 14 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave (SAW) resonator comprising:
a multilayer piezoelectric substrate, the multilayer piezoelectric substrate including a layer of piezoelectric material having a lower surface bonded to an upper surface of a layer of a second material different from the piezoelectric material that improves the temperature stability and reliability of the SAW resonator, the upper surface of the layer of the second material including a trap rich layer which reduces a parasitic surface conductivity of the layer of second material, the layer of piezoelectric material being bonded to the layer of the second material with an adhesive material, a layer of silicon dioxide disposed between the layer of piezoelectric material and the layer of the second material, the lower surface of the layer of piezoelectric material directly bonded to an upper surface of the layer of silicon dioxide, the upper surface of the layer of second material directly bonded to a lower surface of the layer of silicon dioxide, a lower surface of the layer of the second material being roughened;

a plurality of interdigital transducer electrodes disposed on the multilayer piezoelectric substrate; and a layer of dielectric material disposed on an upper surface of the interdigital transducer electrodes and the multilayer piezoelectric substrate.

2. The SAW resonator of claim 1 wherein the layer of piezoelectric material is directly bonded to the layer of the second material.

3. The SAW resonator of claim 2 wherein the layer of piezoelectric material is covalently bonded to the layer of the second material.

4. The SAW resonator of claim 2 wherein the lower surface of the layer of piezoelectric material bonded to the layer of the second material is roughened.

5. The SAW resonator of claim 2 wherein a plurality of obstacles formed of the second material extend from the upper surface of the layer of the second material into the layer of piezoelectric material.

6. The SAW resonator of claim 1 wherein the layer of second material is a continuous layer.

7. The SAW resonator of claim 6 wherein the layer of second material is bonded to the lower surface of the layer of piezoelectric material beneath an entirety of the SAW resonator.

8. The SAW resonator of claim 1 wherein the layer of piezoelectric material is thinner than the layer of the second material.

9. The SAW resonator of claim 8 wherein the layer of piezoelectric material is at least twice as thick as a wavelength of a main acoustic wave excitable by the SAW resonator.

10. The SAW resonator of claim 1 wherein the second material has a lower coefficient of thermal expansion than the piezoelectric material.

11. The SAW resonator of claim 1 wherein the second material has a higher thermal conductivity than the piezoelectric material.

12. The SAW resonator of claim 1 wherein the second material has a higher toughness than the piezoelectric material.

13. The SAW resonator of claim 1 wherein the second material is selected from the group consisting of silicon, aluminum nitride, silicon nitride, magnesium oxide spinel, magnesium oxide crystal, or sapphire.

14. The SAW resonator of claim 1 wherein one of the upper surface or the lower surface of the layer of silicon dioxide is roughened.

15. The SAW resonator of claim 1 wherein each of the upper surface and the lower surface of the layer of silicon dioxide is roughened.

16. The SAW resonator of claim 1 wherein the adhesive material is a metal.

17. An electronics module having at least one radio frequency filter including at least one surface acoustic wave resonator, the surface acoustic wave resonator comprising:

a multilayer piezoelectric substrate including a layer of piezoelectric material having a lower surface, and a layer of a second material different from the piezoelectric material having an upper surface bonded to the lower surface of the layer of piezoelectric material, the second material reducing insertion loss, increasing power durability, increasing reliability, and/or reducing sensitivity of operating parameters of the filter to changes in temperature, the upper surface of the layer of the second material including a trap rich layer which reduces a parasitic surface conductivity of the layer of second material, the layer of piezoelectric material being bonded to the layer of the second material with an adhesive material, a layer of silicon dioxide disposed between the layer of piezoelectric material and the layer of the second material, the lower surface of the layer of piezoelectric material directly bonded to an upper surface of the layer of silicon dioxide, the upper surface of the layer of second material directly bonded to a lower surface of the layer of silicon dioxide, a lower surface of the layer of the second material being roughened; and a plurality of interdigital transducer electrodes disposed on the multilayer piezoelectric substrate.

18. An electronic device with an electronics module having at least one radio frequency filter including at least one surface acoustic wave resonator, the at least one surface acoustic wave resonator comprising:

a multilayer piezoelectric substrate including a layer of piezoelectric material having a lower surface, and a layer of a second material different from the piezoelectric material having an upper surface bonded to the lower surface of the layer of piezoelectric material, the second material reducing insertion loss, increasing power durability, increasing reliability, reducing sensitivity of operating parameters of the filter to changes in temperature, and/or increasing battery life of the electronic device, the upper surface of the layer of the second material including a trap rich layer which reduces a parasitic surface conductivity of the layer of second material, the layer of piezoelectric material being bonded to the layer of the second material with an adhesive material, a layer of silicon dioxide disposed between the layer of piezoelectric material and the layer of the second material, the lower surface of the layer of piezoelectric material directly bonded to an upper surface of the layer of silicon dioxide, the upper surface of the layer of second material directly bonded to a lower surface of the layer of silicon dioxide, a lower surface of the layer of the second material being roughened; and a plurality of interdigital transducer electrodes disposed on the multilayer piezoelectric substrate.

* * * * *

UNITED STATES PATENT AND TRADEMARK OFFICE
CERTIFICATE OF CORRECTION

| | |
|---|---|
| PATENT NO. | : 11,750,172 B2 |
| APPLICATION NO. | : 16/993551 |
| DATED | : September 5, 2023 |
| INVENTOR(S) | : Rei Goto et al. |

It is certified that error appears in the above-identified patent and that said Letters Patent is hereby corrected as shown below:

In the Specification

Column 5, Line 65, delete "(Jr)" and insert -- (Ir) --
Column 8, Line 19, delete "Hi" and insert -- $H_1$ --
Column 8, Line 27, delete "Hi" and insert -- $H_1$ --

Signed and Sealed this
Third Day of October, 2023

Katherine Kelly Vidal
*Director of the United States Patent and Trademark Office*